(12) United States Patent
Hwang et al.

(10) Patent No.: US 10,304,539 B2
(45) Date of Patent: May 28, 2019

(54) METHOD OF PERFORMING A WRITE OPERATION BASED ON AN IDLE TIME

(71) Applicant: SAMSUNG ELECTRONICS CO., LTD., Suwon-si, Gyeonggi-do (KR)

(72) Inventors: Intae Hwang, Hwaseong-si (KR); Junseok Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 184 days.

(21) Appl. No.: 15/259,743

(22) Filed: Sep. 8, 2016

(65) Prior Publication Data

US 2017/0092366 A1 Mar. 30, 2017

(30) Foreign Application Priority Data

Sep. 24, 2015 (KR) .................. 10-2015-0135842

(51) Int. Cl.
| | |
|---|---|
| G11C 11/22 | (2006.01) |
| G11C 16/10 | (2006.01) |
| G11C 11/56 | (2006.01) |
| G06F 3/06 | (2006.01) |
| G11C 16/32 | (2006.01) |
| G11C 16/04 | (2006.01) |

(52) U.S. Cl.
CPC .............. *G11C 16/10* (2013.01); *G06F 3/061* (2013.01); *G06F 3/0616* (2013.01); *G06F 3/0619* (2013.01); *G06F 3/0659* (2013.01); *G06F 3/0679* (2013.01); *G11C 11/5628* (2013.01); *G11C 16/32* (2013.01); *G11C 16/0466* (2013.01); *G11C 16/0483* (2013.01); *G11C 2211/5641* (2013.01)

(58) Field of Classification Search
CPC ......... G11C 16/12; G11C 16/06; G11C 16/32; G11C 2216/12; G11C 11/5621
See application file for complete search history.

(56) References Cited

U.S. PATENT DOCUMENTS

| | | | |
|---|---|---|---|
| 7,679,133 B2 | 3/2010 | Son et al. | |
| 8,094,500 B2 | 1/2012 | Paley et al. | |
| 8,205,059 B2 | 6/2012 | Wu et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,677,058 B2 | 3/2014 | Jung et al. | |
| 8,745,325 B2 | 6/2014 | Benhase et al. | |
| 8,874,833 B1 | 10/2014 | Gole | |
| 8,990,458 B2 * | 3/2015 | Yano | G06F 12/0246 710/18 |
| 9,129,859 B2 * | 9/2015 | Liu | H01L 27/11556 |
| 10,008,250 B2 * | 6/2018 | Ramalingam | G11C 11/5628 |
| 2005/0251617 A1 | 11/2005 | Sinclair et al. | |
| 2008/0189473 A1 | 8/2008 | Murray | |
| 2011/0233648 A1 | 9/2011 | Seol et al. | |
| 2014/0013030 A1 | 1/2014 | Yen | |
| 2014/0071753 A1 | 3/2014 | Shin | |
| 2014/0379968 A1 | 12/2014 | Yao et al. | |

* cited by examiner

*Primary Examiner* — Gene N Auduong
(74) *Attorney, Agent, or Firm* — Volentine, Whitt & Francos, PLLC

(57) ABSTRACT

An operation method of a nonvolatile memory system includes receiving a write command from an external device, determining continuity of the write command based on an idle time, and performing a write operation of the write command in one of a fast mode and a normal mode based on the determination result.

10 Claims, 16 Drawing Sheets

METHOD OF PERFORMING A WRITE OPERATION BASED ON AN IDLE TIME

CROSS-REFERENCE TO RELATED APPLICATIONS

A claim for priority under 35 U.S.C. § 119 is made to Korean Patent Application No. 10-2015-0135842 filed Sep. 24, 2015, in the Korean Intellectual Property Office, the entire contents of which are hereby incorporated by reference.

BACKGROUND

Embodiments of the disclosure described herein relate to a semiconductor memory, and more particularly, relate to an operation mode of a nonvolatile memory system.

A semiconductor memory device refers to a memory device that is implemented using a semiconductor such as silicon (Si), germanium (Ge), gallium arsenide (GaAs), or indium phosphide (InP). A semiconductor memory device is roughly divided into a volatile memory device and a nonvolatile memory device.

A volatile memory device refers to a memory device which loses data stored therein at power-off. The volatile memory device includes a static random access memory (SRAM), a dynamic RAM (DRAM), and a synchronous DRAM. A nonvolatile memory device refers to a memory device which retains data stored therein even at power-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (ReRAM), and a ferroelectric RAM (FRAM).

A flash memory is widely used as mass storage media. Nowadays, as an interface technique is developed, a demand on the flash memory with improved performance is increasing. Moreover, when the flash memory repeats a program operation and an erase operation as many as a specific frequency, the validity of data stored therein is not guaranteed. That is, since a flash memory based storage device has a life of a specific level, various methods are being developed to improve the life of the flash memory.

SUMMARY

Embodiments of the disclosure provide an operation method of a nonvolatile memory system that changes an operation mode based on the continuity of a write command, thereby improving performance and life of the nonvolatile memory system.

According to an embodiment of the disclosure, an operation method of a nonvolatile memory system may include receiving a write command from an external device, determining continuity of the write command based on an idle time, and performing a write operation of the write command in one of a fast mode and a normal mode based on the determination result.

According to an embodiment of the disclosure, the nonvolatile memory system may include a first region and a second region. Each of the first and second regions may include a plurality of memory cells, the plurality of memory cells of the first region may be configured to store N (here, N being a natural number) data bits per cell, and the plurality of memory cells of the second region may be configured to store M (here, M being a natural number greater than N) data bits per cell.

According to an embodiment of the disclosure, the fast mode may indicate an operation mode in which the write operation is performed at the first region and the normal mode may indicate an operation mode in which the write operation is performed at the second region.

According to an embodiment of the disclosure, the nonvolatile memory system may include a first region storing one data bit per cell and a second region storing three data bits per cell. The operation method of the nonvolatile memory system may include receiving a first write command from an external device, performing a first write operation of the received first write command at the second region, receiving a second write command from the external device, determining continuity between the first and second write commands based on an idle time between the first write command and the second write command, and performing a second write operation of the second write command at one region of the first and second regions based on the determination result.

According to an embodiment of the disclosure, the nonvolatile memory system may include a buffer region and a main region. The operation method of the nonvolatile memory system may include receiving a write command from an external device, determining continuity between the write command and at least one previous write command based on an idle time, calculating the cumulative size of write data of the write command and the at least one previous write command when the write command is continuous with the at least one previous write command, comparing the calculated cumulative size with a reference size, performing the write operation of the received write command at the buffer region based on the fast mode when the calculated cumulative size is greater than or equal to the reference size, and performing the write operation of the received write command at the main region based on the normal mode when the calculated cumulative size is less than the reference size.

According to an embodiment of the disclosure, an operation method of a nonvolatile memory system may include: (a) identifying a current command as continuous when a period between the completion of a previous command and the receipt of the current command is less than a predetermined period; b) determining whether to write first data identified by the current command to memory cells of the nonvolatile memory system designated to store N-bits per cell or memory cells of the nonvolatile memory system designated to store M-bits per cell based on whether the current command is identified as continuous, wherein the N is a integer greater than or equal to 1 and the M is an integer greater than the N; and c) writing the first data to the nonvolatile memory system in accordance with the determination of operation (b).

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, for descriptive convenience, the disclosure is explained based on specific embodiments. However, embodiments of the disclosure may not be limited thereto. For example, a variety of embodiments or combinations thereof may be implemented.

A nonvolatile memory system according to an embodiment of the disclosure may determine continuity of a write command received from a host based on an idle time. The nonvolatile memory system may perform a write operation about the received write command in a fast mode or a normal mode based on the determination result. That is, the nonvolatile memory system may process a continuous write command in a fast mode, and thus the performance of writing mass data may be improved. In contrast, the nonvolatile memory system may process a discontinuous write command in a normal mode, and thus the life of the nonvolatile memory system may be improved. Here, the term "continuous write command" may be used to indicate a first write command that is received within a reference time after a second write command is received. This may mean that the first write command and the second write command are not gapless but continuous within the reference time. Alternatively, the term "continuous write command" may mean that the first write command and the second write command are gapless but separate (or independent). In other words, the expression that the first write command and the second write command are continuous may mean that a time between the first write command and the second write command is present. Continuous write commands may mean that the write commands are received within the reference time. Likewise, the expression that a first write command is continuous with a second write command and the expression that the first and second write commands are continuous with each other may mean that the first and second write commands are received within the reference time.

Figure 1:
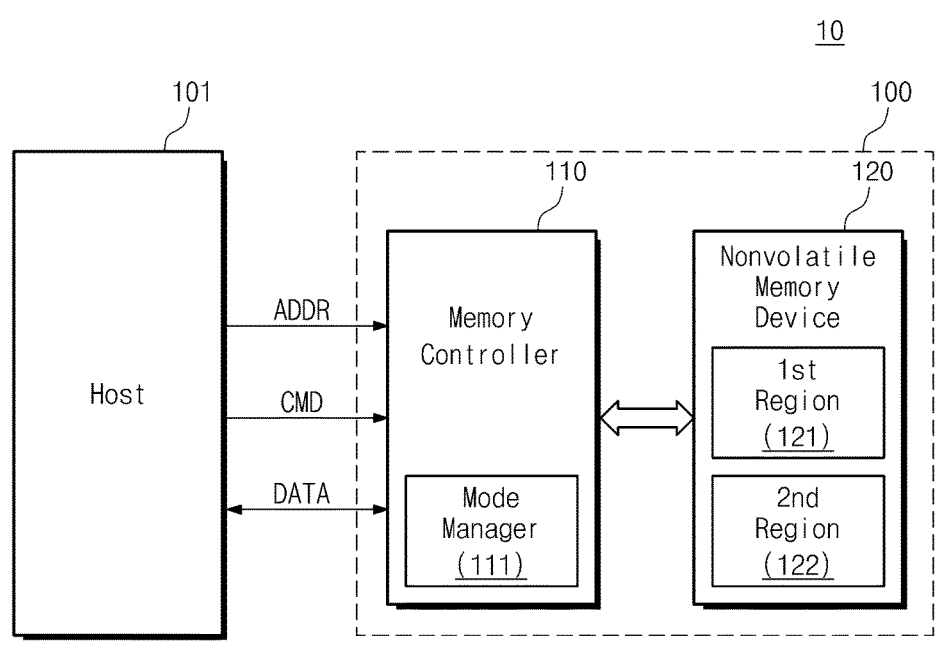
FIG. 1 is a block diagram illustrating a user system according to an embodiment of the disclosure.

FIG. 1 is a block diagram illustrating a user system according to an embodiment of the disclosure. Referring to FIG. 1, the user system 10 may include a host 101 and a nonvolatile memory system 100. In an embodiment, the user system 10 may be a computer, a portable computer, an ultra-mobile personal computer (UMPC), a workstation, a server computer, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting or receiving information in a wireless environment, or one of various electronic devices constituting a home network.

The host 101 may perform various operations of the user system 10. For example, the host 101 may drive an operating system that the user system 10 uses and may execute various application programs on the operating system. The host 101 may store data in the nonvolatile memory system 100 or may read data stored therein. In an embodiment, the host 101 may be a central processing unit (CPU), an application processor (AP), or separate electronic circuitry.

The nonvolatile memory system 100 may include a memory controller 110 and a nonvolatile memory device 120. The nonvolatile memory system 100 may store data, DATA, received from the host 101 or output the stored data, DATA, under control of the host 101. In an embodiment, the nonvolatile memory system 100 may be provided as a mass storage device or mass storage media, such as a mass memory card, a mass memory stick, an embedded memory card, or a solid state drive (SSD).

The memory controller 110 may receive an address ADDR and a command CMD from the host 101. The memory controller 110 may store data, DATA, in the nonvolatile memory device 120 or output data, DATA, stored in the nonvolatile memory device 120 in response to the received signals. The memory controller 110 may include a mode manager 111. The mode manager 111 may control an operation mode of the nonvolatile memory system 100 based on an idle time of the nonvolatile memory system 100. For example, the mode manager 111 may receive the write command CMD from the host 101 and may determine continuity of the received write command CMD based on the idle time of the nonvolatile memory system 100. The mode manager 111 may control the operation mode of the nonvolatile memory system 100 based on the determination result.

The nonvolatile memory device 120 may store data or output the stored data under control of the memory controller 110. In an embodiment, the nonvolatile memory device 120 may be implemented with nonvolatile memory elements such as electrically erasable and programmable ROM (EEPROM), NAND flash memory, NOR flash memory, phase-change RAM (PRAM), resistive RAM (ReRAM), ferroelectric RAM (FRAM), and spin-torque magnetic RAM (STT-MRAM). For descriptive convenience, it may be assumed that the nonvolatile memory device 120 is a NAND flash memory. In an embodiment, the nonvolatile memory device 120 may be implemented with a plurality of chips, a plurality of dies, or a plurality of packages.

In an embodiment, the nonvolatile memory device 120 may include a first region 121 and a second region 122. Each of the first and second regions 121 and 122 may be a data storage space that includes a plurality of memory cells. The first and second regions 121 and 122 may be physically divided from each other. For example, the first and second regions 121 and 122 may be divided by a memory cell unit, by a word line unit, by a memory block unit, by a plane unit, by a chip unit, or by a package unit. Alternatively, the first and second regions 121 and 122 may be logically classified from each other. For example, the first and second regions 121 and 122 may be logically classified by a flash translation layer (FTL) of the memory controller 110.

In an embodiment, each of the plurality of memory cells included in the first region 121 may be a single-level cell (SLC) storing one bit, and each of the plurality of memory cells included in the second region 122 may be a multi-level cell (MLC) storing at least two bits. Alternatively, each of the plurality of memory cells included in the first region 121 may store N bits, and each of the plurality of memory cells included in the second region 122 may store M bits. Here, N is a natural number, and M is a natural number greater than N. In an embodiment, a speed at which the plurality of memory cells included in the first region 121 operate may be faster than a speed at which the plurality of memory cells included in the second region 122 operate.

In an embodiment, the data received from the host 101 may be stored in the first region 121 or the second region 122 based on the operation mode managed by the mode manager 111. For example, when the operation mode of the nonvolatile memory system 100 is set to a fast mode by the mode manager 111, the data received from the host 101 may be stored in the first region 121. When the operation mode of the nonvolatile memory system 100 is set to a normal mode by the mode manager 111, the data received from the host 101 may be stored in the second region 122. In an embodiment, the data stored in the first region 121 may be migrated to the second region 122 during a background operation under control of the memory controller 110. In an embodiment, the first region 121 may be a buffer region, and the second region 122 may be a main region. In an embodiment, the first region 121 may be an SLC region, and the second region 122 may be an MLC or a triple-level cell (TLC) region.

In an embodiment, an SLC program operation may be performed in the fast mode, and a TLC program operation may be performed in the normal mode.

As described above, since the operation speed of the memory cells of the first region 121 is faster than that of the memory cells of the second region 122, the operation performance of the nonvolatile memory system 100 may be improved when the nonvolatile memory system 100 operates in the fast mode. In contrast, a separate migration operation may not be performed when the nonvolatile memory system 100 operates in the normal mode, thereby improving the life-time of the nonvolatile memory system 100.

As described above, according to an embodiment of the disclosure, the memory controller 110 may determine the continuity of the received write command CMD based on the idle time and may control the operation mode of the nonvolatile memory system 100 based on the determination result. That is, the operation mode may be controlled based on the continuity of the write command that is determined based on the idle time, thereby improving the performance and life of the nonvolatile memory system 100.

Figure 2:
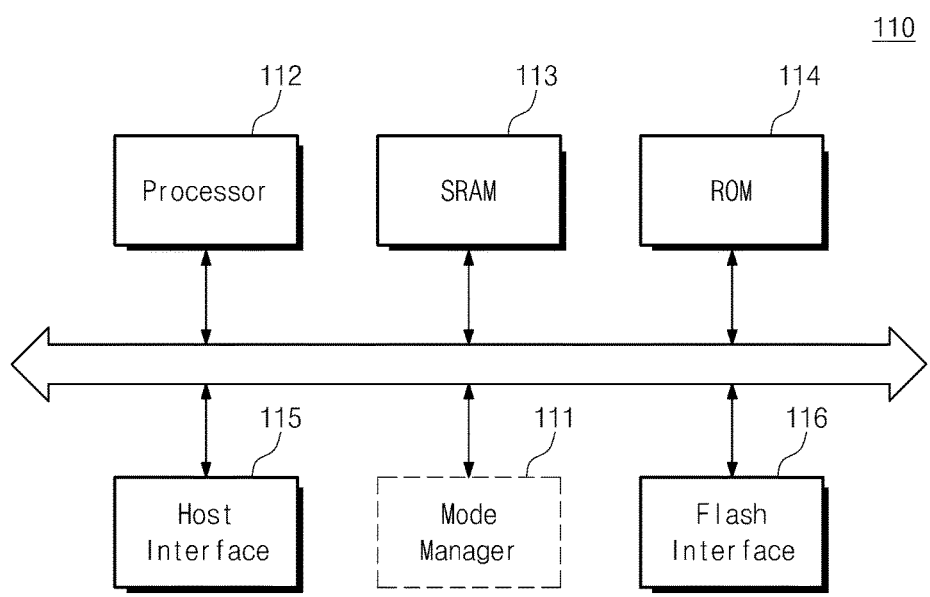
FIG. 2 is a block diagram illustrating a memory controller of FIG. 1.

FIG. 2 is a block diagram illustrating the memory controller of FIG. 1. Referring to FIGS. 1 and 2, the memory controller 110 may include the mode manager 111, a processor 112, an SRAM 113, a ROM 114, a host interface 115, and a flash interface 116.

The mode manager 111 is described with reference to FIG. 1, and a detailed description thereof is thus omitted.

The processor 112 may control an overall operation of the memory controller 110. The SRAM 113 may be used as a buffer memory, a cache memory, and a working memory of the memory controller 110. The ROM 114 may store a variety of information or programs, needed for the memory controller 110 to operate, in the form of firmware.

In an embodiment, the mode manager 111 may be implemented with hardware, software, or a combination thereof. The mode manager 111 that is implemented with software may be stored in the SRAM 113 and may be driven by the processor 112. Alternatively, the mode manager 111 may be included in the flash translation layer (FTL) of the memory controller 110. The flash translation layer may convert the address ADDR (i.e., a logical address) from the host 101 to a physical address that is usable in the nonvolatile memory device 120. In an embodiment, the flash translation layer may perform maintenance operations of the nonvolatile memory system 100 such as wear leveling and garbage collection (GC). In an embodiment, the flash translation layer may be stored in the SRAM 113 and may be driven by the processor 112.

The memory controller 110 may communicate with the host 101 through the host interface 115. For example, the host interface 115 may include at least one of a double data rate (DDR) interface, a universal serial bus (USB), a multimedia card (MMC), an eMMC (embedded MMC), a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), Firewire, a universal flash storage (UFS), or a nonvolatile memory express (NVMe). The memory controller 110 may communicate with the nonvolatile memory device 120 through the flash interface 116.

Figure 3:
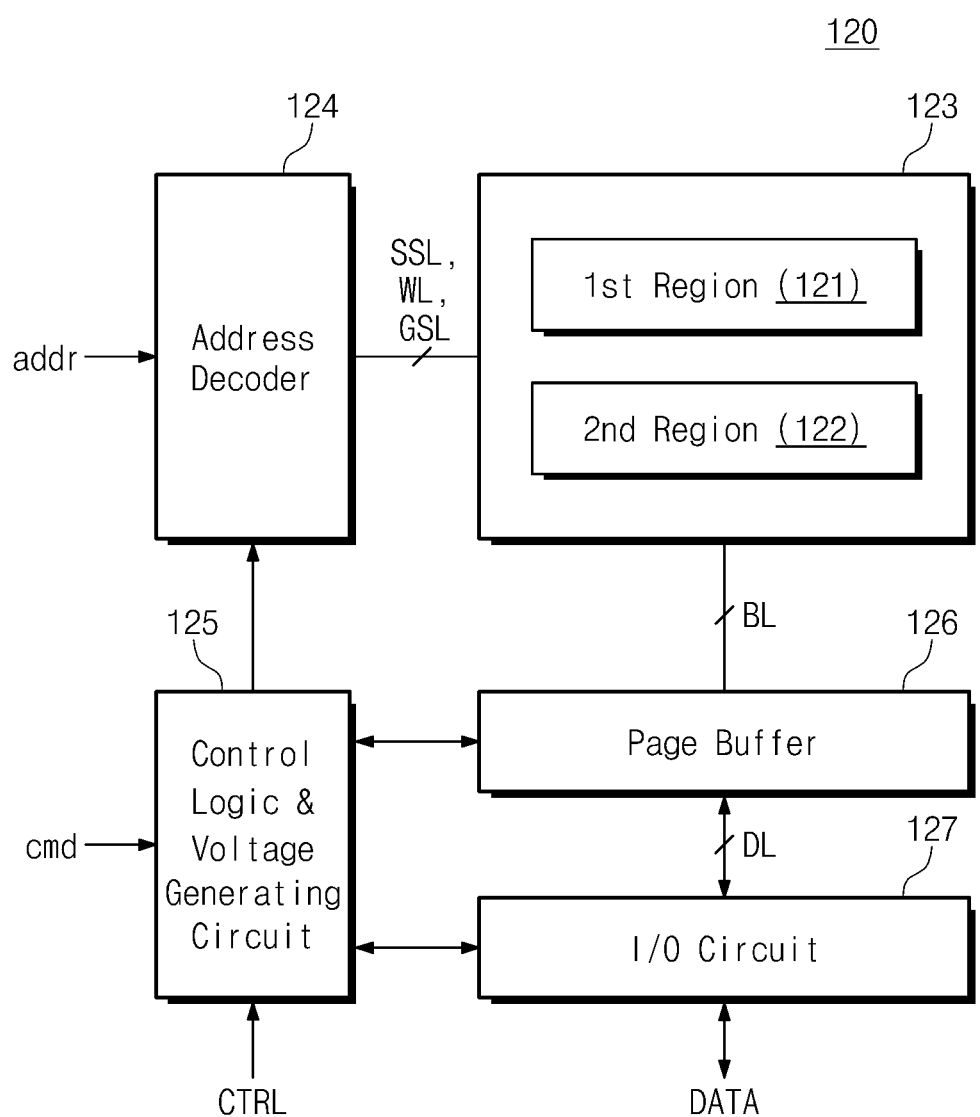
FIG. 3 is a block diagram illustrating a nonvolatile memory device of FIG. 1.

FIG. 3 is a block diagram illustrating the nonvolatile memory device of FIG. 1. Referring to FIGS. 1 and 3, the nonvolatile memory device 120 may include a memory cell array 123, an address decoder 124, a control logic and voltage generating circuit 125, a page buffer 126, and an input/output circuit 127.

The memory cell array 123 may include a plurality of memory blocks. Each of the memory blocks may include a plurality of memory cells. The plurality of memory cells may be connected to a plurality of word lines WL. Each memory cell may be a single-level cell (SLC) storing one bit or a multi-level cell (MLC) storing at least two bits.

In an embodiment, the memory cell array 123 may include the first and second regions 121 and 122. For example, a part of the plurality of memory blocks in the memory cell array 123 may be included in the first region 121, and the others may be included in the second region 122. Each of the memory cells of the memory blocks of the first region 121 may operate as the single-level cell (SLC) storing one bit, and each of the memory cells of the memory blocks of the second region 122 may operate as the multi-level cell (MLC) storing at least two bits. Each of the memory cells of the memory blocks of the first region 121 may store N bits, and each of the memory cells of the memory blocks of the second region 122 may store M bits. Here, N is a natural number, and M is a natural number greater than or equal to N.

In an embodiment, as described above, the first and second regions 121 and 122 may be divided by a memory cell unit, by a word line unit, by a memory block unit, by a plane unit, by a chip unit, or by a package unit. However, embodiments the disclosure may not be limited to an embodiment illustrated in FIG. 3. For example, the nonvolatile memory system 100 may include a plurality of nonvolatile memory devices. Some of the plurality of nonvolatile memory devices may be included in the first region 121, and the remaining nonvolatile memory devices may be included in the second region 122.

The address decoder 124 may be connected with the memory cell array 123 through the plurality of word lines WL, string selection lines SSL, and ground selection lines GSL. The address decoder 124 may receive and decode an address "addr" provided by the memory controller 110. The address decoder 124 may select at least one of the word lines WL based on the decoded address and may adjust a voltage of the selected word line. In an embodiment, the address "addr" may be a physical address corresponding to the address ADDR from the host 101.

The control logic and voltage generating circuit 125 may receive a command "cmd" and a control signal CTRL from the memory controller 110 and may control the address decoder 124, the page buffer 126, and the input/output circuit 127 in response to the received signals. In an embodiment, the command "cmd" may be a signal that is obtained by converting the command CMD from the host 101 at the memory controller 110.

The control logic and voltage generating circuit 125 may generate various voltages for operations of the nonvolatile memory device 120. For example, the control logic and voltage generating circuit 125 may generate a plurality of program voltages, a plurality of verification voltages, a plurality of selection read voltages, a plurality of non-selection read voltages, a plurality of erase voltages, and a plurality of erase verification voltages.

In an embodiment, during a program, read, or erase operation of the nonvolatile memory device 120, word line voltages to be applied to the plurality of word lines may vary based on the operation speed and cell size of memory cells connected to each word line and word line positions.

The page buffer 126 may be connected to the memory cell array 123 through a plurality of bit lines BL. The page buffer 126 may be connected to the input/output circuit 127 through a plurality of data lines DL. Under control of the control logic and voltage generating circuit 125, the page buffer 126 may adjust voltages of the plurality of bit lines BL to allow data received through the data lines DL to be programmed in the memory cell array 123. The page buffer 126 may sense voltages of the plurality of bit lines BL and may read data stored in the memory cell array 123 under control of the control logic and voltage generating circuit 125.

The input/output circuit 127 may exchange data with the memory controller 110. The input/output circuit 127 may provide data, DATA, received from the memory controller 110 to the page buffer 126 through the plurality of data lines DL. The input/output circuit 127 may send data, DATA, to the memory controller 110 in synchronization with the control signal CTRL.

In an embodiment, the nonvolatile memory device 120 may include a three-dimensional memory array. The 3-dimensional memory array may be monolithically formed in one or more physical levels of a memory cell array having an active area arranged on a circuit, which is related to a silicon substrate and an operation of memory cells. The circuit associated with an operation of memory cells may be located in the substrate or on the substrate. The term "monolithically" may mean that layers of each level in a 3-dimensional array are directly deposited on layers of a lower level in the 3-dimensional array.

According to an embodiment of the disclosure, the 3-dimensional memory array may have a vertical-directional characteristic and may include vertical NAND strings in which at least one memory cell is located on another memory cell. The at least one memory cell may comprise a charge trap layer. Each vertical NAND string may include at least one select transistor located over memory cells. At least one selection transistor may have the same structure as memory cells and be monolithically formed together with memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
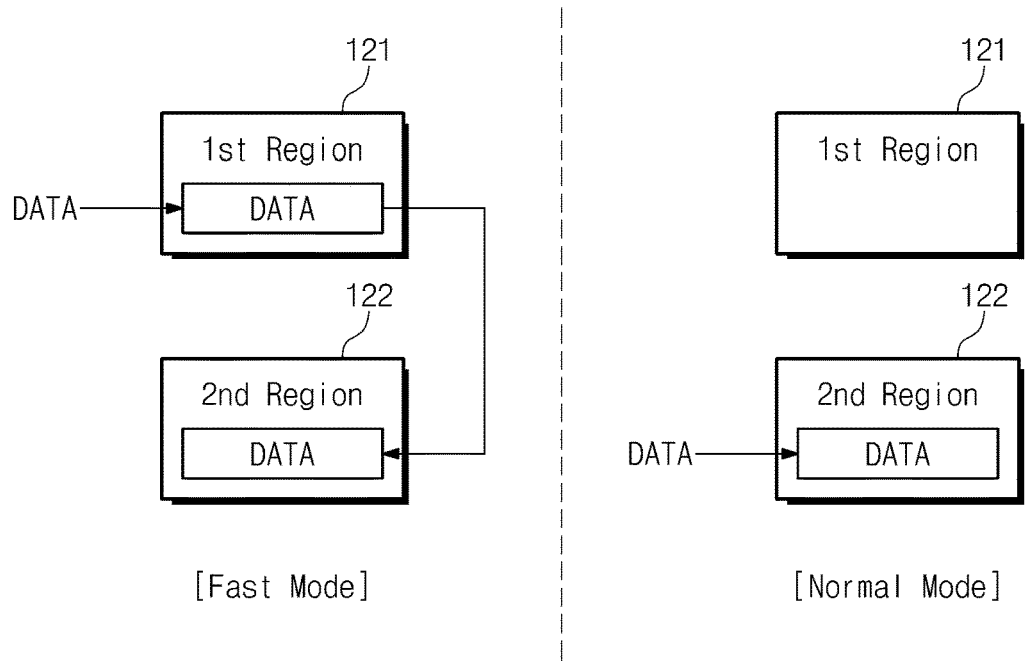
FIG. 4 is a block diagram for describing an operation mode of a nonvolatile memory system of FIG. 1.

FIG. 4 is a block diagram for describing an operation mode of the nonvolatile memory system of FIG. 1. For descriptive convenience, it is assumed that the nonvolatile memory system 100 operates in the fast mode or the normal mode. Furthermore, it is assumed that the fast mode is based on an on-chip buffered (OBP) operation. However, embodiments of the disclosure may not be limited thereto. For example, the fast mode may be implemented in various programming methods each having a write speed faster than that of the normal mode.

Referring to FIGS. 1 and 4, the nonvolatile memory system 100 may operate in the fast mode or the normal mode. For example, when the nonvolatile memory system 100 operates in the fast mode, the memory controller 110 may control the nonvolatile memory device 120 to allow data to be written at the first region 121. Afterwards, the data in the first region 121 may be migrated to the second region 122 during a background operation. When the nonvolatile memory system 100 operates in the normal mode, the memory controller 110 may control the nonvolatile memory device 120 to allow data from the host 101 to be written at the second region 122.

As described above, the nonvolatile memory system 100 may write data at the first region 121, of which the operation speed is fast, in the fast mode, thereby making it possible to store the data from the host 101 quickly. That is, the operation performance of the nonvolatile memory system 100 may be improved in the fast mode. In contrast, the nonvolatile memory system 100 may write data at the second region 122 in the normal mode, thereby preventing data from being migrated additionally. That is, the life of the nonvolatile memory system 100 may be improved in the normal mode.

Below, for descriptive convenience, it is assumed that the fast mode is an operation mode in which the data is written at the first region 121, and the normal mode is an operation mode in which the data is written at the second region 122. However, embodiments of the disclosure may not be limited thereto. For example, the fast and normal modes may be based on different programming methods regardless of a storage region. In this case, the operation speed of the fast mode may be faster than that of the normal mode. Alternatively, the operation mode of the nonvolatile memory system 100 may further include other operation modes in addition to the fast and normal modes.

Figure 5:
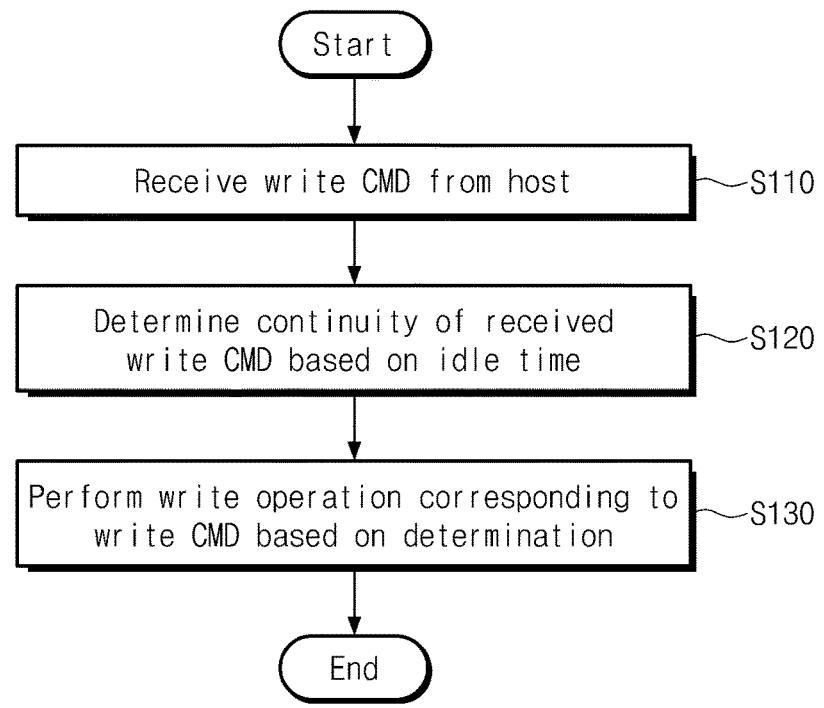
FIG. 5 is a flow chart illustrating an operation of the nonvolatile memory system of FIG. 1.

FIG. 5 is a flow chart illustrating an operation of the nonvolatile memory system of FIG. 1. For descriptive convenience, it is assumed that a command CMD received from the host 101 is a write command unless differently defined below. However, embodiments of the disclosure may not be limited thereto.

Referring to FIGS. 1 and 5, in step S110, the nonvolatile memory system 100 may receive the write command CMD from the host 101. For example, the nonvolatile memory system 100 may receive the write command CMD from the host 101 in compliance with the predetermined communication protocol. For example, the predetermined communication protocol may include at least one of various communication protocols, such as a double data rate (DDR) interface, a universal serial bus (USB), a multimedia card (MMC), an eMMC (embedded MMC), a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), Firewire, a universal flash storage (UFS), or a nonvolatile memory express (NVMe).

In step S120, the nonvolatile memory system 100 may determine continuity of the received write command CMD based on an idle time. For example, the nonvolatile memory system 100 may receive a first write command CMD and may perform a write operation of the received first write command CMD. Afterwards, the nonvolatile memory system 100 may receive a second write command CMD. In this case, the nonvolatile memory system 100 may determine whether the idle time between the first write command and the second write command is shorter than a reference time RT. When the idle time is shorter than the reference time RT, the nonvolatile memory system 100 may determine that the first write command and the second write command are continuous with each other. When the idle time is longer than or equal to the reference time RT, the nonvolatile memory system 100 may determine that the first write command and the second write command are not continuous with each other.

In an embodiment, the idle time may indicate a time when the nonvolatile memory system 100 remains at an idle state, and the idle state may indicate a state at which the nonvolatile memory system 100 does not operate or at which there is no request or command from the host 101. That is, the idle time between the first write command and the second write command may indicate a time from a point in time when an operation about the first write command is completed to a point on time when the second write command is received.

In step S130, the nonvolatile memory system 100 may perform the write operation corresponding to the received write command CMD based on the determination result. For example, when the determination result indicates that the currently received write command CMD and an immediately previous write command are continuous with each other, the nonvolatile memory system 100 may perform the write operation corresponding to the received write command CMD based on the fast mode. That is, when the determination result indicates that the received write command CMD is the write command that is continuous, the nonvolatile memory system 100 may write data from the host 101 at the first region 121.

When the determination result indicates that the received write command CMD is the write command that is not continuous, the nonvolatile memory system 100 may perform the write operation corresponding to the received write command CMD based on the normal mode. That is, when the determination result indicates that the received write command CMD is the write command that is not continuous, the nonvolatile memory system 100 may write data from the host 101 at the second region 122.

As described above, the nonvolatile memory system 100 may determine the continuity of the received write command CMD based on the idle time and may change the operation mode based on the determination result. That is, since the nonvolatile memory system 100 operates in the fast mode and the normal mode based on the continuity of the write command CMD, the performance and life of the nonvolatile memory system 100 may be improved.

Figure 6:
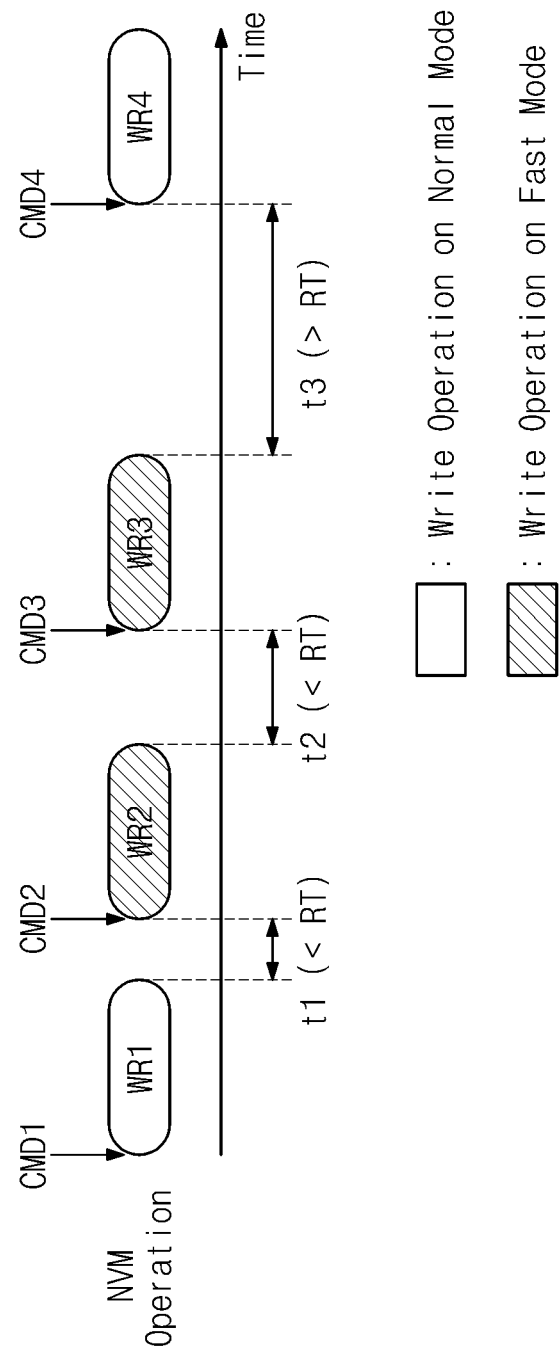
FIGS. 6 and 7 are timing diagrams for describing the operation of FIG. 5.
Figure 7:
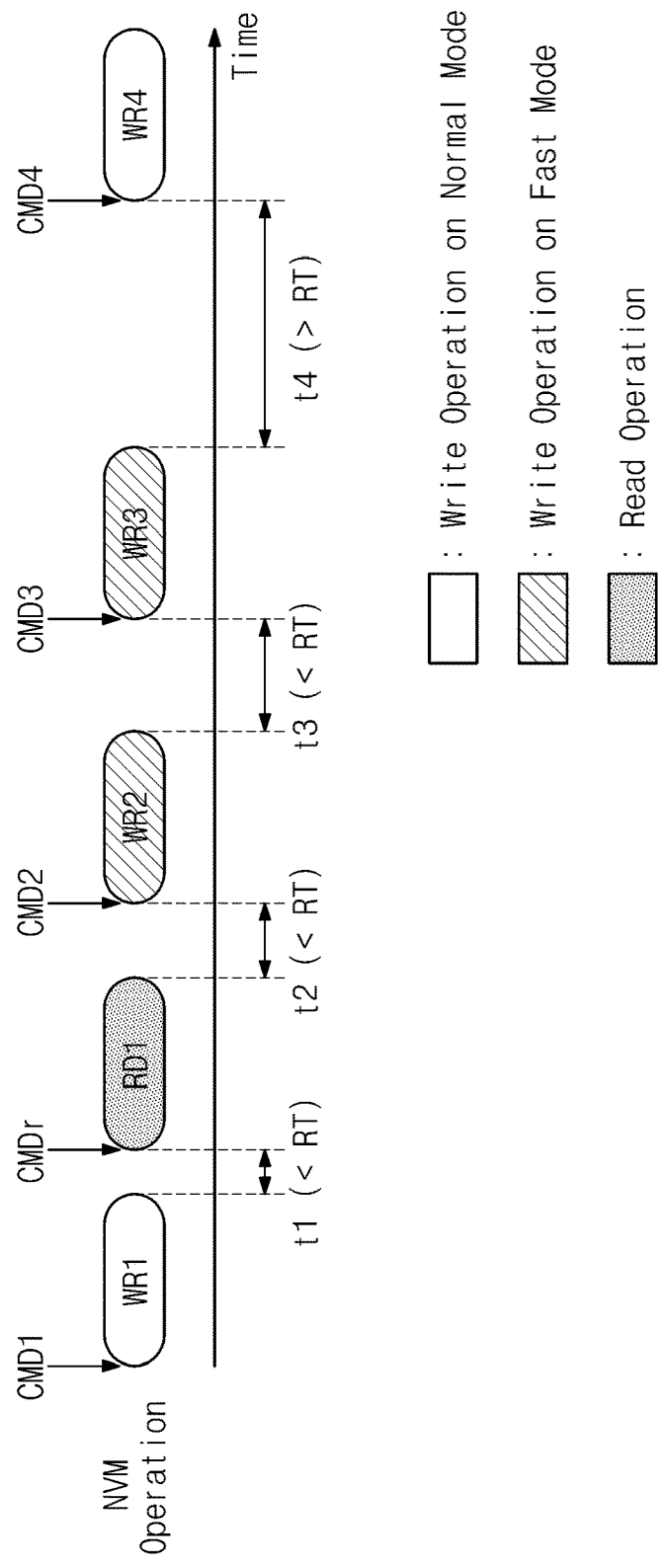

FIGS. 6 and 7 are timing diagrams for describing the operation of FIG. 5. For descriptive convenience, a write operation of the nonvolatile memory device 120 is illustrated in FIGS. 6 and 7. However, embodiments of the disclosure may not be limited thereto. For example, the memory controller 110 may receive a write command from the host 101 and may control the write operation of the nonvolatile memory device 120 corresponding to the received write command. Furthermore, it is assumed that an operation time of each write operation indicates a time from a point in time when the write command is received to a point in time when the write operation corresponding to the write command is completed. Furthermore, the memory controller 110 may sense and manage the idle times between the write operations of the nonvolatile memory device 120.

Referring to FIGS. 1 and 6, the nonvolatile memory device 120 may perform first to fourth write operations WR1 to WR4 under control of the memory controller 110, respectively. The first to fourth write operations WR1 to WR4 may be operations corresponding to first to fourth write commands CMD1 to CMD4, respectively. That is, the first to fourth write operations WR1 to WR4 may be operations corresponding to, respectively, write commands CMD1 to CMD4 that are different from each other. The first to fourth write operations WR1 to WR4 may be write operations of first to fourth data, respectively.

First, the nonvolatile memory device 120 may perform the first write operation WR1 under control of the memory controller 110. In an embodiment, the first write operation WR1 may be an operation corresponding to the first write command CMD1 from the host 101 and may be performed in the normal mode. That is, the nonvolatile memory device 120 may write the first data at the second region 122 under control of the memory controller 110.

After a first idle time t1 elapses from a point in time when the first write operation WR1 is completed, the nonvolatile memory device 120 may perform the second write operation WR2 under control of the memory controller 110. In an embodiment, the second write operation WR2 may be a write operation corresponding to the second write command CMD2 from the host 101. The memory controller 110 may compare the first idle time t1, which is a time period from a point in time when the first write operation WR1 is completed to a point in time when the second write command CMD2 is received (or the second write operation starts), with a reference time RT.

In an embodiment, when the first idle time t1 is shorter than the reference time RT, the mode manager 111 of the memory controller 110 may determine that the second write command CMD2 is continuous with a previous write command, that is, the first write command CMD1. In this case (that is, the second write command CMD2 is continuous with the first write command CMD1), the nonvolatile memory device 120 may perform the second write operation WR2 based on the fast mode under control of the memory controller 110. That is, the memory controller 110 may control the nonvolatile memory device 120 to allow the second data to be written at the first region 121 of the nonvolatile memory device 120. Accordingly, the memory controller 110 may set the operation mode to allow the nonvolatile memory device 120 to operate in the fast mode.

Likewise, after a second idle time t2 elapses from a point in time when the second write operation WR2 is completed, the nonvolatile memory device 120 may perform the third write operation WR3. The third write operation WR3 may be a write operation corresponding to the third write command CMD3 from the host 101. As in the second write operation WR2 described above, the memory controller 110 may determine the continuity of the third write command by comparing the second idle time t2 with the reference time RT. As illustrated in FIG. 6, when the second idle time t2 is shorter than the reference time RT, the nonvolatile memory device 120 may perform the third write operation WR3 based on the fast mode. That is, the memory controller 110 may control the nonvolatile memory device 120 to allow the third data to be written at the first region 121 of the nonvolatile memory device 120. Accordingly, the memory controller 110 may set the operation mode to allow the nonvolatile memory device 120 to operate in the fast mode.

After a third idle time t3 elapses from a point in time when the third write operation WR3 is completed, the nonvolatile memory device 120 may perform the fourth write operation WR4. The fourth write operation WR4 may be a write operation corresponding to the fourth write command CMD4 from the host 101. The memory controller 110 may compare the third idle time t3 with the reference time RT. Unlike the above-described second and third write operations WR2 and WR3, the third idle time t3 may be longer than the reference time RT. That is, it may be determined that the third write command and the fourth write command are not continuous with each other. In other words, the third and fourth write commands may be discontinuous with each other.

In this case, the nonvolatile memory device 120 may perform the fourth write operation WR4 based on the normal mode. That is, the memory controller 110 may control the nonvolatile memory device 120 to allow the fourth data to be written at the second region 122 of the nonvolatile memory device 120. Accordingly, the memory controller 110 may set the operation mode to allow the nonvolatile memory device 120 to operate in the normal mode.

Referring to FIGS. 1 and 7, the nonvolatile memory device 120 may perform first to fourth write operations WR1 to WR4 and a first read operation RD1 under control of the memory controller 110. The nonvolatile memory device 120 may perform the first write operation WR1 corresponding to a first write command CMD1 under control of the memory controller 110. In an embodiment, the nonvolatile memory device 120 may perform the first write operation WR1 based on the normal mode under control of the memory controller 110.

After a first idle time t1 elapses from a point in time when the first write operation WR1 is completed, the nonvolatile memory device 120 may perform the first read operation RD1 under control of the memory controller 110. In an embodiment, the first read operation RD1 may be an operation corresponding to a read command CMDr.

After a second idle time t2 elapses from a point in time when the first read operation RD1 is completed, the non-volatile memory device 120 may perform the second write operation WR2 under control of the memory controller 110. In an embodiment, the memory controller 110 may determine continuity of the second write command CMD2 based on the first or second idle times t1 or t2.

For example, in an embodiment described with reference to FIG. 6, the memory controller 110 may sequentially receive the first to fourth write commands CMD1 to CMD4 and may determine the continuity of each write command based on the idle time between a currently received write command and a previously received write command. However, in an embodiment of FIG. 7, the read command CMDr may be received between the first write command CMD1 and the second write command CMD2. In this case, the memory controller 110 may determine the continuity of the second write command CMD2 based on the write and read commands (that is, the idle times (that is, the first and second idle times t1 and t2) between the first and second write commands CMD1 and CMD2) received before the second write command CMD2.

In more detail, the idle times between the first and second write commands CMD1 and CMD2 may be the first and second idle times t1 and t2. When each of the first and second idle times t1 and t2 is shorter than the reference time RT, the memory controller 110 may determine that the second write command CMD2 is a write command that is continuous. When the second write command CMD is determined as the write command that is continuous, the memory controller 110 may control the nonvolatile memory device 120 to allow the second write operation WR2 to be performed based on the fast mode.

Afterwards, the nonvolatile memory device 120 may perform the third and fourth write operations WR3 and WR4 under control of the memory controller 110. The third and fourth write operations WR3 and WR4 are described with reference to FIG. 6, and a detailed description thereof is thus omitted.

In an embodiment, when a sum (that is, t1+t2) of the first idle time t1 and the second idle time t2 is shorter than the reference time RT, the memory controller 110 may determine that the first and second write commands CMD1 and CMD2 are continuous with each other.

As described above, the nonvolatile memory system 100 may determine the continuity of the received write command based on the idle time and may control the operation mode based on the determination result. For example, to store mass video data, the host 101 may continuously send write commands to the nonvolatile memory system. In this case, the nonvolatile memory system 100 may need the fast operation speed to process mass video data quickly. The nonvolatile memory system 100 may determine the continuity of the received write commands based on the idle time and may operate in the fast mode based on the determination result, thereby making it possible to process the write operation of mass video data from the host 101 quickly.

In contrast, when the host 101 does not continuously send write commands, the fast operation speed may not be needed because there is enough time to perform a write operation of write data. In this case, the nonvolatile memory system 100 may determine the continuity of the received write command based on the idle time and may operate in the normal mode based on the determination result. Accordingly, an operation of a write command from the host 101 may be performed normally. Moreover, since data is not migrated from the first region 121 to the second region 122, the life of the nonvolatile memory system 100 may be improved.

Figure 8:
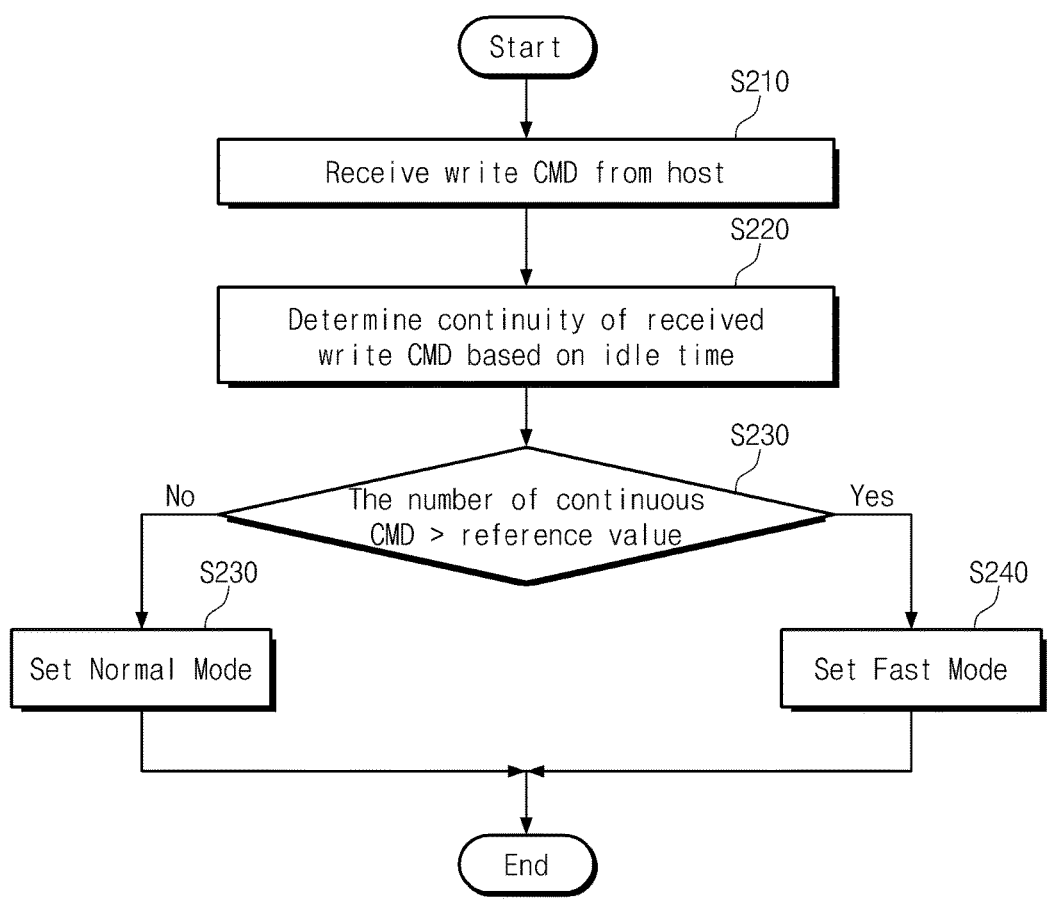
FIG. 8 is a flow chart illustrating an operation of the nonvolatile memory system of FIG. 1, according to another embodiment.

FIG. 8 is a flow chart illustrating an operation of the nonvolatile memory system of FIG. 1, according to another embodiment. Referring to FIGS. 1 and 8, the nonvolatile memory system 100 may perform operations of steps S210 and S220. Operations of steps S210 and S220 may be similar to those of steps S110 and S120 of FIG. 5, and a detailed description thereof is thus omitted.

In step S230, the nonvolatile memory system 100 may compare the number of write commands CMD that are continuous with a reference value. For example, through step S220, the nonvolatile memory system 100 may determine continuity of the received write command CMD. In an embodiment, the nonvolatile memory system 100 may determine continuity of each of previous write commands.

In more detail, the nonvolatile memory system 100 may sequentially receive first to fourth write commands from the host 101 and may sequentially perform write operations about the first to fourth write commands. In this case, the nonvolatile memory system 100 may determine continuity of each write command through the continuity determining operation described with reference to FIGS. 5 to 7. When the determination result of the nonvolatile memory system 100 indicates that the second write command is continuous with the first write command, that the third write command is continuous with the second write command, and that the fourth write command is continuous with the third write command, the first to fourth write commands may be write commands that are continuous. Below, for descriptive convenience, when the idle time between at least two write commands is shorter than the reference time, the at least two write commands may be referred to as "continuous write commands".

As described above, when the first to fourth write commands are continuous with each other, the number of write commands that are continuous may be '4'. In another embodiment, after the fourth write command, fifth to eighth write commands may be sequentially received from the host 101. When the fourth write command is not continuous with the fifth write command and when the fifth to eighth write commands are continuous with each other, the first to fourth write commands may be continuous with each other, and the fifth to eighth write commands may be continuous with each other. However, the first to eighth write commands may not be continuous with each other.

When the number of write commands that are continuous is not greater than the reference value, in step S230, the nonvolatile memory system 100 may set the operation mode to the normal mode. In an embodiment, the nonvolatile memory system 100 may perform the write operation corresponding to the write command received in step S210, based on the set normal mode.

When the number of write commands that are continuous is greater than the reference value, in step S240, the nonvolatile memory system 100 may set the operation mode to the fast mode. In an embodiment, the nonvolatile memory system 100 may perform the write operation corresponding to the write command received in step S210, based on the set fast mode.

Figure 9:
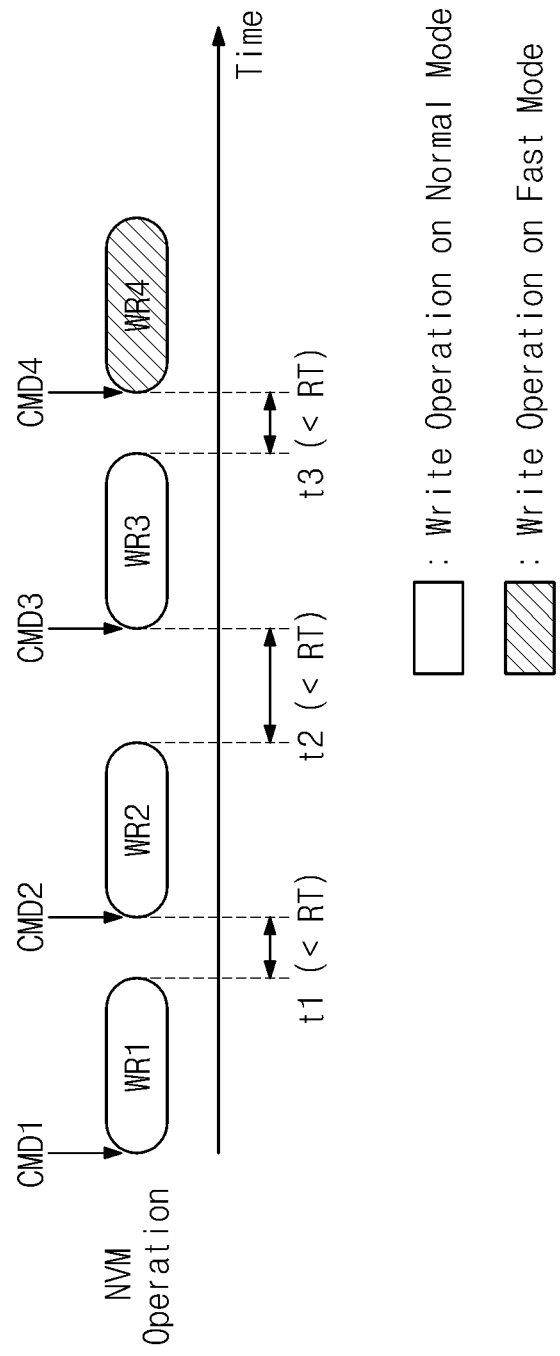
FIG. 9 is a timing diagram for describing the operation of FIG. 8.

FIG. 9 is a timing diagram for describing the operation of FIG. 8. For descriptive convenience, a description of elements or operations which are similar to the above-described elements or operations may be omitted.

Referring to FIGS. 1, 8, and 9, the nonvolatile memory device 120 may sequentially perform first to fourth write operations WR1 to WR4 under control of the memory controller 110. The first to fourth write operations WR1 to WR4 may correspond to first to fourth write commands CMD1 to CMD4, respectively. Each of the first to third idle times t1 to t3 may be shorter than a reference time RT, where the first idle time t1 is between the first and second write commands CMD1 and CMD2, the second idle time t2 is between the second and third write commands CMD2 and CMD3, and the third idle time t3 is between the third and fourth write commands CMD3 and CMD4. In this case, as described above, the first to fourth write commands CMD1 to CMD4 may be continuous with each other.

As described with reference to FIG. 8, when the reference value is '3', the nonvolatile memory device 120 may perform the first to third write operations WR1 to WR3 based on the normal mode. That is, the number of write commands that are continuous may be '1' at a point in time when the first write command CMD1 is received. The number of write commands that are continuous may be '2' at a point in time when the second write command CMD2 is received. The number of write commands that are continuous may be '3' at a point in time when the third write command CMD3 is received. In this case, since the number of write commands that are continuous is not greater than the reference value, the first to third write operations WR1 to WR3, which correspond to, respectively, the first to third write commands CMD1 to CMD3, may be performed based on the normal mode.

Afterwards, the number of write commands that are continuous may be '4' at a point in time when the fourth write command CMD4 is received. In this case, since the number of write commands that are continuous is greater than the reference value (that is, '3'), the fourth write operation WR4 corresponding to the fourth write command CMD4 may be performed based on the fast mode.

As described above, the nonvolatile memory system 100 may determine continuity of the received write command based on the idle time and may control the operation mode by comparing the number of write commands that are continuous based on the determination result with the reference value. Therefore, this may mean that the performance and life of the nonvolatile memory system are improved.

Figure 10:
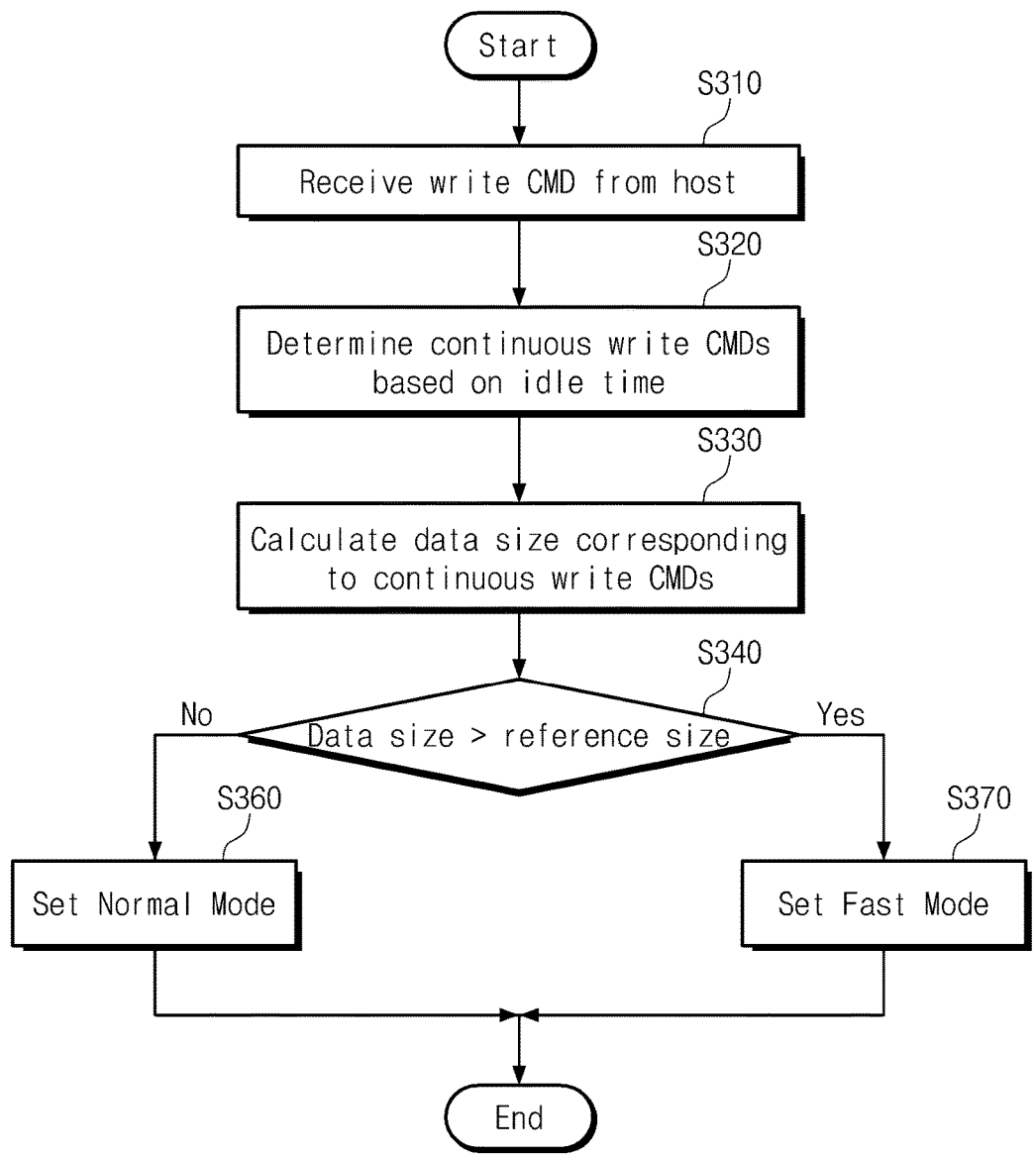
FIG. 10 is a flow chart illustrating an operation of the nonvolatile memory system of FIG. 1, according to still another embodiment.

FIG. 10 is a flow chart illustrating an operation of the nonvolatile memory system of FIG. 1, according to still another embodiment. For descriptive convenience, a description of the above-described elements and operations may be omitted.

Referring to FIGS. 1 and 10, the nonvolatile memory system 100 may perform operations of steps S310 and S320. Operations of steps S310 and S320 may be similar to those of steps S110 and S120 of FIG. 5, and a detailed description thereof is thus omitted.

In step S330, the nonvolatile memory system 100 may calculate a cumulative size of write data corresponding to write commands that are continuous. For example, the nonvolatile memory system 100 may sequentially receive first to fourth write commands from the host 101. The first to fourth write commands may be write commands that are continuous. Each of the first to fourth write commands may be a write command of 4 KB of data. At a point in time when the fourth write command is received, the cumulative size of the write data may be 16 KB, which is a sum of data sizes corresponding to each of the first to fourth write commands. In other words, the nonvolatile memory system 100 may calculate the sum of the write data sizes of write commands that are continuous with the received write command (i.e., the cumulative size of the write data).

In step S340, the nonvolatile memory system 100 may compare the cumulative size of data with a reference size.

For example, the nonvolatile memory system 100 may compare the calculated cumulative size of write data with the reference size.

When the calculated cumulative size of write data is not greater than the reference size, in step S360, the nonvolatile memory system 100 may set the operation mode to the normal mode. When the calculated cumulative size of write data is greater than the reference size, in step S370, the nonvolatile memory system 100 may set the operation mode to the fast mode.

Figure 11:
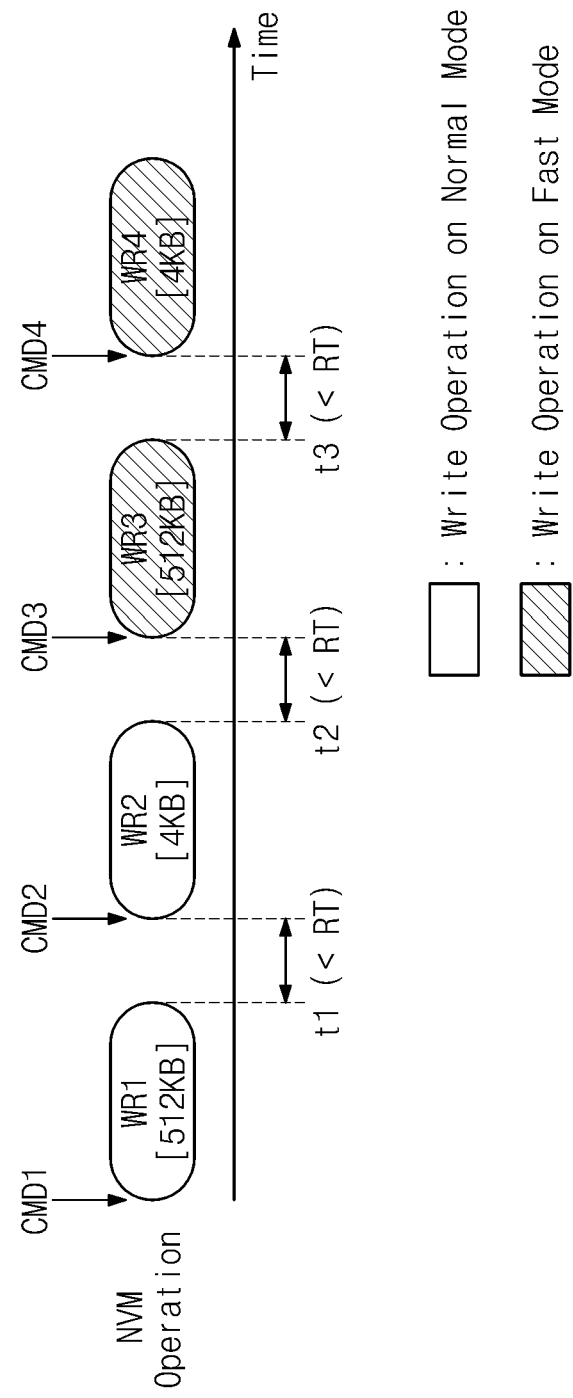
FIG. 11 is a timing diagram for describing the operation of FIG. 10.

FIG. 11 is a timing diagram for describing the operation of FIG. 10. For descriptive convenience, a description of the above-described elements and methods may be omitted. Referring to FIGS. 1, 10 and 11, the memory controller 110 may sequentially receive the first to fourth write commands CMD1 to CMD4 from the host 101, and the nonvolatile memory device 120 may sequentially perform first and fourth write operations WR1 to WR4 under control of the memory controller 110. The first to fourth write operations WR1 to WR4 may correspond to the first to fourth write commands CMD1 to CMD4, respectively.

As described above, each of first to third idle times t1, t2, and t3 associated with the first to fourth write commands CMD1 to CMD4 may be shorter than a reference time RT. That is, the first to fourth write commands CMD1 to CMD4 may be continuous with each other.

In an embodiment, the size of the write data corresponding to each of the first and third write commands CMD1 and CMD3 may be 512 KB, and the size of the write data corresponding to each of the second and fourth write commands CMD2 and CMD4 may be 4 KB. In an embodiment, information about the size of the write data may be included in a write command, a reserved region of the write command, a reserved command, a separately defined command, a vendor command, or a combination thereof.

In an embodiment, the reference size is assumed as 1024 KB to describe an embodiment in detail. At a point in time when the first write command CMD1 is received, the cumulative size of the write data that are continuous may be 512 KB. In this case, since the cumulative size (that is, 512 KB) of the write data that are continuous for the first write command CMD1 is less than the reference size (that is, 1024 KB), the first write operation WR1 corresponding to the first write command CMD1 may be performed based on the normal mode.

At a point in time when the second write command CMD2 is received, the cumulative size of the write data that are continuous may be 516 KB (that is, 512 KB+4 KB) since the first and second write commands CMD1 and CMD2 are continuous with each other. In this case, since the cumulative size (that is, 516 KB) of the write data that are continuous for the second write command CMD2 is less than the reference size (that is, 1024 KB), the second write operation WR2 corresponding to the second write command CMD2 may be performed based on the normal mode.

At a point in time when the third write command CMD3 is received, the cumulative size of the write data that are continuous may be 1028 KB (that is, 512 KB+4 KB+512 KB) since the first to third write commands CMD1 to CMD3 are continuous with each other. In this case, since the cumulative size (that is, 1028 KB) of the write data that are continuous for the third write command CMD3 is greater than the reference size (that is, 1024 KB), the third write operation WR3 corresponding to the third write command CMD3 may be performed based on the fast mode.

Likewise, at a point in time when the fourth write command CMD4 is received, since the first to fourth write commands CMD1 to CMD4 are continuous with each other and the cumulative size of the write data that are continuous is 1032 KB (that is, 512 KB+4 KB+512 KB+4 KB), the fourth write operation WR4 corresponding to the fourth write command CMD4 may be performed based on the fast mode.

As described above, the nonvolatile memory system 100 according to an embodiment of the disclosure may determine continuity of the received write data based on the idle time and may calculate the cumulative size of the write data that are continuous based on the determination result. The nonvolatile memory system 100 may control the operation mode based on the cumulative size of the write data that are continuous. Therefore, this may mean that the performance and life of the nonvolatile memory system are improved.

Figure 12:
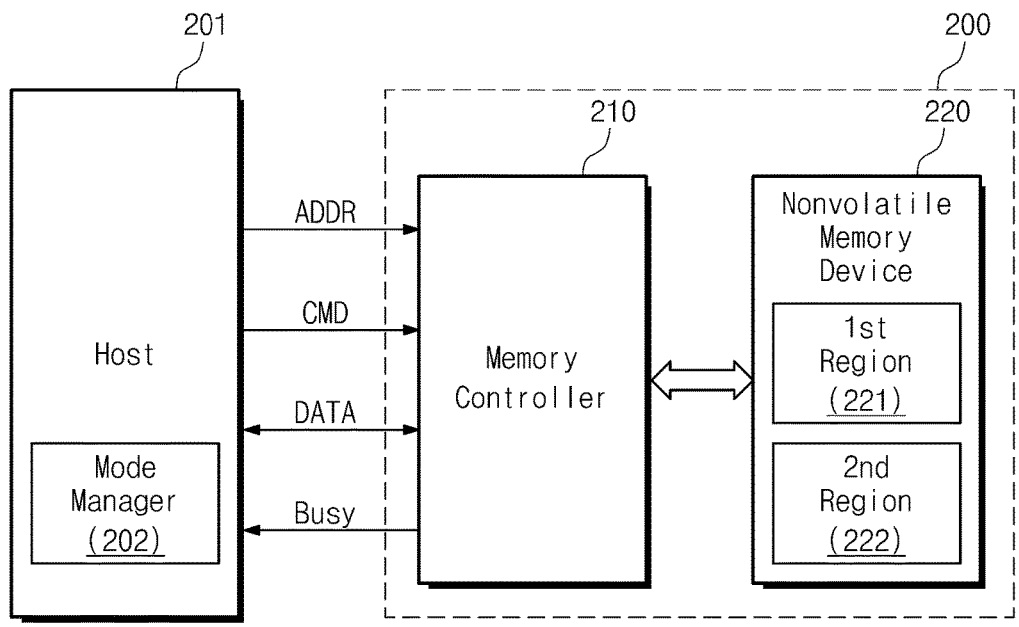
FIG. 12 is a block diagram illustrating a user system according to another embodiment of the disclosure.

FIG. 12 is a block diagram illustrating a user system according to another embodiment of the disclosure. For descriptive convenience, a description of elements or operations which are duplicated with the above-described elements or operations may be omitted.

Referring to FIG. 12, a user system 20 may include a host 201 and a nonvolatile memory system 200. The nonvolatile memory system 200 may include a memory controller 210 and a nonvolatile memory device 220. The nonvolatile memory device 220 may include a first region 221 and a second region 222.

Unlike the host 101 of FIG. 1, the host 201 of FIG. 12 may include a mode manager 202. As described with reference to FIGS. 1 to 11, the mode manager 202 may determine continuity of a write command based on an idle time and may control an operation mode of the nonvolatile memory system 200 based on the determination result.

For example, the mode manager 202 may determine the continuity of the write command CMD to be provided to the nonvolatile memory system 200 based on the idle time of the nonvolatile memory system 200. The mode manager 202 may control the operation mode of the nonvolatile memory system 200 based on the determined continuity. Alternatively, the mode manager 202 may detect the number of write commands that are continuous based on the determined continuity and may compare the detected number of write commands with a reference value to control the operation mode of the nonvolatile memory system 200. Alternatively, the mode manager 202 may calculate a cumulative size of write data of write commands that are continuous based on the determined continuity and may compare the calculated cumulative size of write data with the reference value to control the operation mode of the nonvolatile memory system 200.

In an embodiment, the nonvolatile memory system 200 may provide the host 201 with a busy signal, Busy. The busy signal, Busy, may be a signal that indicates whether the nonvolatile memory system 200 operates or not. That is, when the busy signal, Busy, is activated, the nonvolatile memory system 200 may be performing an operation of a command from the host 201 or may be performing another operation. When the busy signal, Busy, is not activated, the nonvolatile memory system 200 may be in a sleep state. The mode manager 202 may manage the idle time of the nonvolatile memory system 200 based on the busy signal, Busy, from the nonvolatile memory system 200.

In an embodiment, the mode manager 202 may manage an operation mode of the nonvolatile memory system 200 through a command, which is defined by an interface between the host 201 and the nonvolatile memory system 200, a reserved command, a vendor command, or a combination thereof.

As described above, the host 201 configured to control the nonvolatile memory system 200 may include the mode manager 202 that manages the operation mode of the nonvolatile memory system 200. The mode manager 202 may determine the continuity of write data to be sent to the nonvolatile memory system 200 based on the idle time of the nonvolatile memory system 200 and may control the operation mode of the nonvolatile memory system 200 based on the determination result. Therefore, a nonvolatile memory system, a host and a user system including the nonvolatile memory system and the host may be provided with improved performance and reliability.

Figure 13:
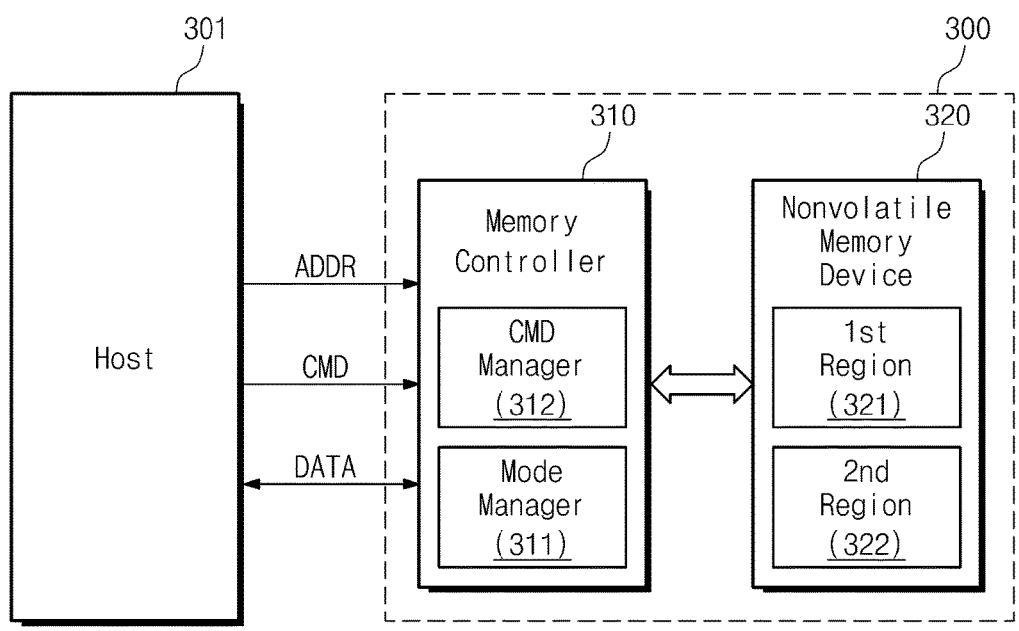
FIG. 13 is a block diagram illustrating a user system according to still another embodiment of the disclosure.

FIG. 13 is a block diagram illustrating a user system according to still another embodiment of the disclosure. For descriptive convenience, a description of elements or operations which are duplicated with the above-described elements or operations may be omitted.

Referring to FIG. 13, the user system 30 may include a host 301 and a nonvolatile memory system 300. The nonvolatile memory system 300 may include a memory controller 310 and a nonvolatile memory device 320. The memory controller 310 may include a command manager 312 and a mode manager 311. The nonvolatile memory device 320 may include a first region 321 and a second region 322. The host 301, the memory controller 310, the nonvolatile memory device 320, the mode manager 311, the first region 321, and the second region 322 are described with reference to FIGS. 1 to 11, and a detailed description thereof is thus omitted.

Unlike the memory controller 110 of FIG. 1, the memory controller 310 may further include the command manager 312. The command manager 312 may manage a command CMD from the host 301. For example, the command manager 312 may receive a plurality of commands from the host 301 and may manage the received commands in a command queue. That is, the command manager 312 may receive the plurality of commands from the host 301 and may manage the plurality of commands to allow each of the received commands to be sequentially performed.

The mode manager 311 may calculate a cumulative size of write data of write commands from among commands managed by the command manager 312. For example, the mode manager 311 may sum up the cumulative size of write data among commands managed by the command manager 312.

The mode manager 311 may compare the cumulative size of write data with a reference size and may control an operation mode of the nonvolatile memory system 300 based on the determination result. For example, when the cumulative size of the write data is greater than the reference size, the mode manager 311 may control the nonvolatile memory device 320 to allow the nonvolatile memory device 320 to operate in the fast mode or may set the operation mode to the fast mode. When the cumulative size of the write data is not greater than the reference size, the mode manager 311 may control the nonvolatile memory device 320 to allow the nonvolatile memory device 320 to operate in the normal mode or may set the operation mode to the normal mode.

Figure 14:
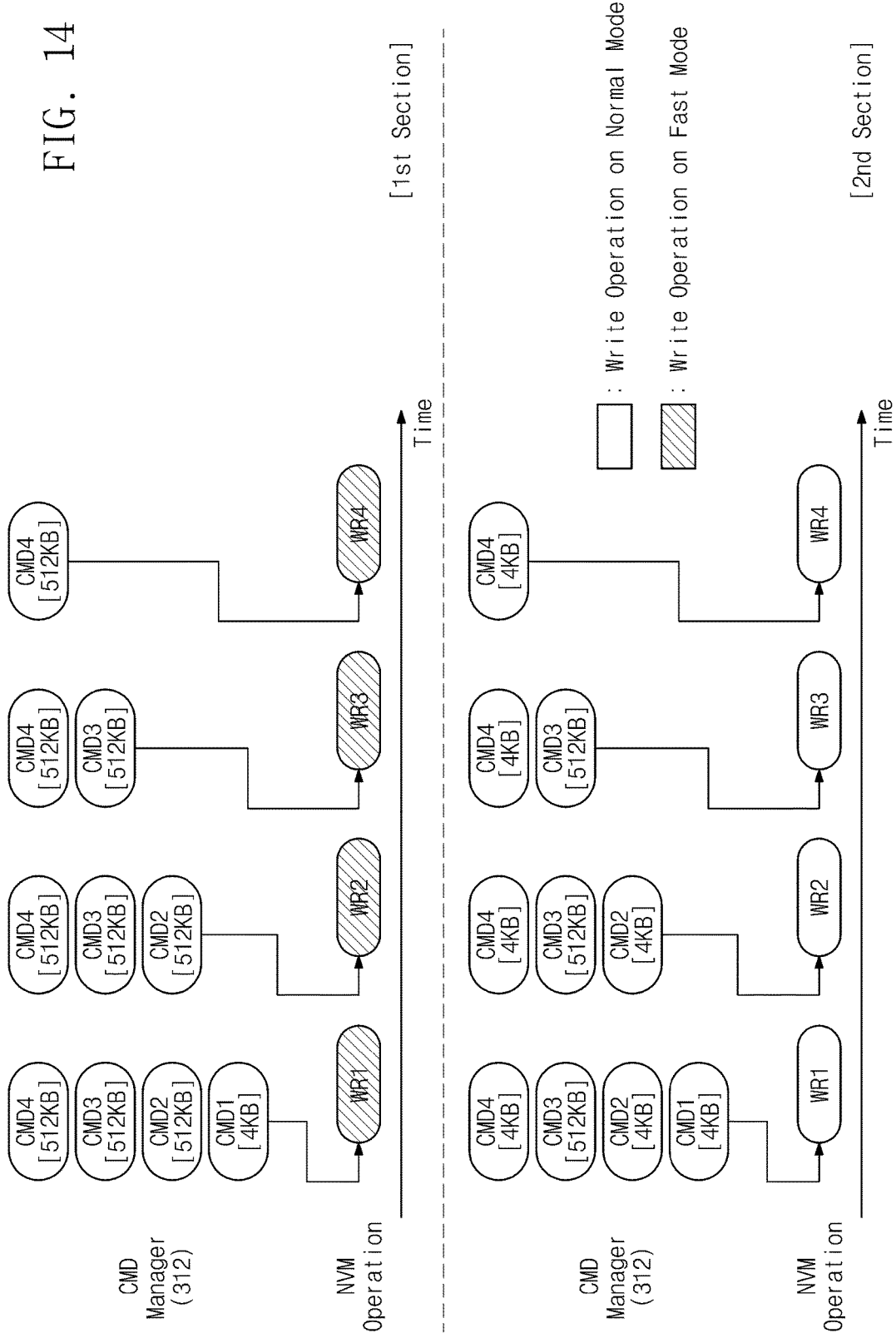
FIG. 14 is a timing diagram for describing an operation of a nonvolatile memory system of FIG. 13.

FIG. 14 is a timing diagram for describing an operation of the nonvolatile memory system of FIG. 13. For descriptive convenience and ease of illustration, elements which are unnecessary to describe the operation mode of the nonvolatile memory system 300 will be omitted.

Referring to FIGS. 13 and 14, the command manager 312 may manage first to fourth write commands CMD1 to CMD4 from the host 301. In an embodiment, a size of write data of the first write command CMD1 illustrated in a first section may be 4 KB, and a size of write data of each of the second to fourth write commands CMD2 to CMD4 may be 512 KB. A size of write data of each of the first, second, and fourth write commands CMD1, CMD2, and CMD4 illustrated in a second section may be 4 KB, and a size of write data of the third write command CMD3 may be 512 KB.

The reference size is assumed as 1024 KB to describe an embodiment in detail. As described above, the mode manager 311 may calculate the cumulative size of write data of the first to fourth write commands CMD1 to CMD4 managed by the command manager 312. The cumulative size of write data of the first to fourth write commands illustrated in the first section may be 1540 KB (that is, 4 KB+512 KB+512 KB+512 KB). In this case, since the cumulative size of write data is greater than the reference size (that is, 1024 KB), the mode manager 311 may control the nonvolatile memory device 320 or change the operation mode to allow the first to fourth write operations WR1 to WR4 corresponding to the first to fourth write commands CMD1 to CMD4 to be performed based on the fast mode. In contrast, the cumulative size of write data of the first to fourth write commands illustrated in the second section may be 524 KB. In this case, since the cumulative size of write data is not greater than the reference size (that is, 1024 KB), the mode manager 311 may control the nonvolatile memory device 320 or change the operation mode to allow the first to fourth write operations WR1 to WR4 corresponding to the first to fourth write commands CMD1 to CMD4 to be performed based on the normal mode.

According to another embodiment of the disclosure, the nonvolatile memory system 300 may control the operation mode based on the cumulative size of write data of write commands managed by the command manager 312. Therefore, this may mean that the performance and life of the nonvolatile memory system are improved.

Figure 15:
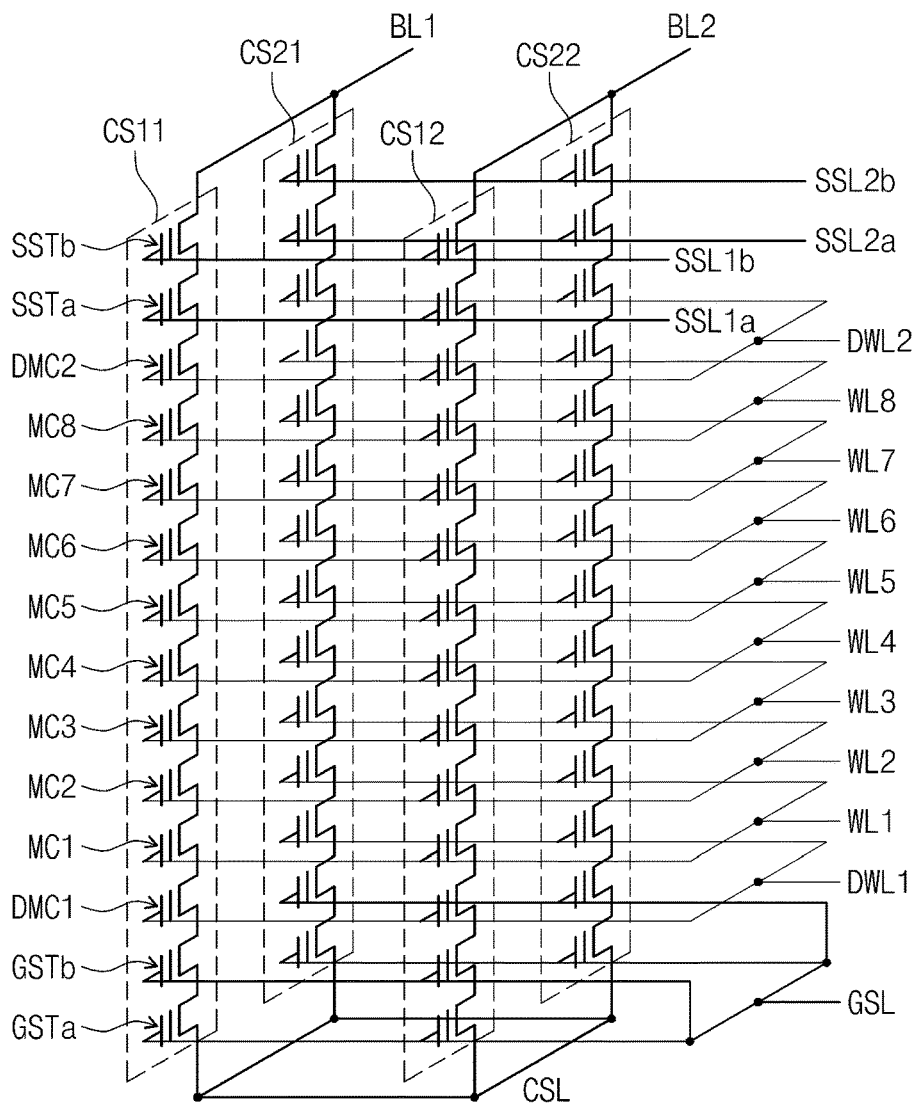
FIG. 15 is a circuit diagram schematically illustrating a first memory block from among memory blocks included in the nonvolatile memory device, according to an embodiment of the disclosure.

FIG. 15 is a circuit diagram schematically illustrating a first memory block from among memory blocks included in the nonvolatile memory device, according to an embodiment of the disclosure. In FIG. 15, there is illustrated the first memory block BLK1 having a three-dimensional structure. However, embodiments of the disclosure may not be limited thereto. For example, the remaining memory blocks may have the same structure as the first memory block BLK1.

Referring to FIG. 15, the first memory block BLK1 may include a plurality of cell strings CS11, CS12, CS21, and CS22. The cell strings CS11, CS12, CS21, and CS22 may be arranged along a row direction and a column direction and may form rows and columns. For example, the cell strings CS11 and CS12 may be connected to string selection lines SSL1a and SSL1b to form a first row. The cell strings CS21 and CS22 may be connected to string selection lines SSL2a and SSL2b to constitute a second row. For example, the cell strings CS11 and CS21 may be connected to a first bit line BL1 to constitute a first column. The cell strings CS12 and CS22 may be connected to a second bit line BL2 to form a second column.

Each of the cell strings CS11, CS12, CS21, and CS22 may include a plurality of cell transistors. Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In an embodiment, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by a row direction and a column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In an embodiment, a first dummy memory cell DMC1 may be disposed between the memory cells MC1 to MC8 and the ground selection transistors GSTa and GSTb. In an embodiment, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

In an embodiment, even though not illustrated in drawings, ground selection transistors provided at the same height from a substrate (not shown) may be connected to the same ground selection line, and ground selection transistors provided at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, memory cells MC1 to MC8 of the cell strings CS11, CS12, CS21, and CS22 may be connected in common to first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Even though not shown, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an embodiment, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

In the first memory block BLK1, read and write operations may be performed by the row. For example, one row of the memory block BLK1 may be selected by the string selection lines SSL1a, SSL1b, SSL2a, and SSL2b.

The cell strings CS11 and CS12 in the first row may be respectively connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row may be respectively connected to the bit lines BL1 and BL2 when the turn-on voltage is supplied to the string selection lines SSL2a and SSL2b and the turn-off voltage is supplied to the string selection lines SSL1a and SSL1b. As a word line is driven, memory cells, placed at the same height, from among memory cells in cell strings connected to the driven word line may be selected. Read and write operations may be performed with respect to the selected memory cells. The selected memory cells may constitute a physical page unit.

In the memory block BLK1, memory cells may be erased by the memory block or by the sub-block. When erasing is performed by the memory block, all memory cells MC in the memory block BLK1 may be simultaneously erased according to an erase request. When erasing is performed by the sub-block, a portion of memory cells MC in the memory block BLK1 may be simultaneously erased according to an erase request, while the other memory cells MC thereof may be erase-inhibited. A low voltage (e.g., a ground voltage) may be supplied to a word line connected to erased memory cells MC, and a word line connected to erase-inhibited memory cells MC may be floated.

The first memory block BLK1 illustrated in FIG. 15 may be an example. For example, the number of cell strings may increase or decrease, and the number of rows of cell strings and the number of columns of cell strings may increase or decrease according to the number of cell strings. In the first memory block BLK1, the number of cell transistors (GST, MC, DMC, SST, or the like) may increase or decrease, and a height of the first memory block BLK1 may increase or decrease according to the number of cell transistors (GST, MC, DMC, SST, or the like). Furthermore, the number of lines (GSL, WL, DWL, SSL, or the like) connected with cell transistors may increase or decrease according to the number of cell transistors (GST, MC, DMC, SST, or the like).

Figure 16:
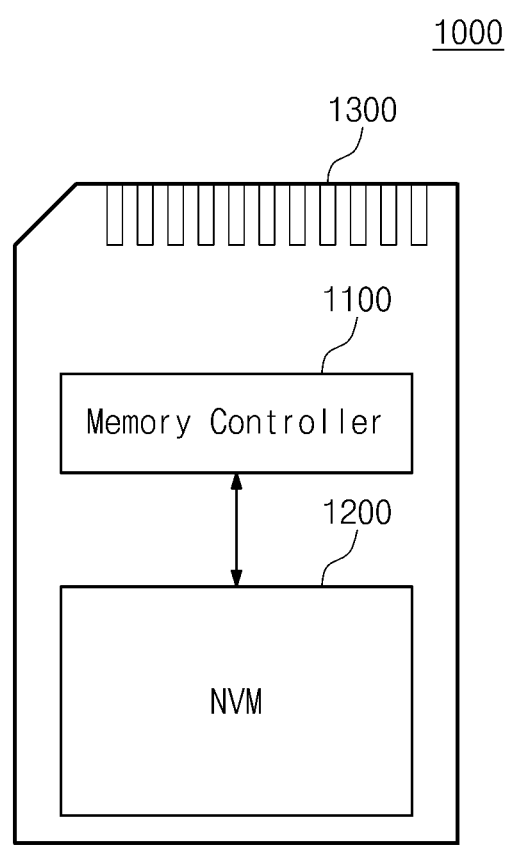
FIG. 16 is a block diagram illustrating a memory card system including the nonvolatile memory system, according to an embodiment of the disclosure.

FIG. 16 is a block diagram illustrating a memory card system including the nonvolatile memory system, according to an embodiment of the disclosure. Referring to FIG. 16, the memory card system 1000 may contain a memory controller 1100, a nonvolatile memory 1200, and a connector 1300.

The memory controller 1100 may be connected to the nonvolatile memory 1200. The memory controller 1100 may be configured to access the nonvolatile memory 1200. For example, the memory controller 1100 may be adapted to control an overall operation of the nonvolatile memory 1200 including, but not limited to, a read operation, a write operation, an erase operation, and a background operation. The background operation may include the following operations: wear-leveling management, garbage collection, and the like.

The memory controller 1100 may provide an interface between the nonvolatile memory 1200 and a host. The memory controller 1100 may be configured to drive firmware for controlling the nonvolatile memory 1200.

In an embodiment, the memory controller 1100 may include elements such as, but not limited to, a RAM, a processing unit, a host interface, a memory interface, and an error correction unit.

The memory controller 1100 may communicate with an external device through the connector 1300. The memory controller 1100 may communicate with the external device (e.g., host) based on a specific communication protocol. For example, the memory controller 1100 may communicate with the external device through at least one of various communication protocols such as, but not limited to, a universal serial bus (USB), a multimedia card (MMC), an eMMC (embedded MMC), a peripheral component interconnection (PCI), a PCI-express (PCI-E), an advanced technology attachment (ATA), a serial-ATA, a parallel-ATA, a small computer small interface (SCSI), an enhanced small disk interface (ESDI), an integrated drive electronics (IDE), Firewire, a universal flash storage (UFS), and a nonvolatile memory express (NVMe).

The nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 1100 and the nonvolatile memory 1200 may be integrated in a single semiconductor device. The memory controller 1100 and the nonvolatile memory 1200 may be integrated in a single semiconductor device to form a solid state drive (SSD). The memory controller 1100 and the nonvolatile memory 1200 may be integrated in a single semiconductor device to constitute a memory card. For example, the memory controller 1100 and the nonvolatile memory 1200 may be integrated in a single semiconductor device to compose a memory card such as, but not limited to, a PC card (a personal computer memory card international association (PCMCIA) card), a compact flash card (CF), a smart media card (SM, SMC), a memory stick, a multimedia card (MMC, RS-MMC, MMCmicro, eMMC), an SD card (SD, miniSD, microSD, SDHC), and a universal flash storage (UFS).

The nonvolatile memory 1200 or the memory card system 1000 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In an embodiment, according to operation methods described with reference to FIGS. 1 to 14, the memory controller 1100 may determine continuity of a write command based on an idle time and may control an operation mode based on the determination result.

Figure 17:
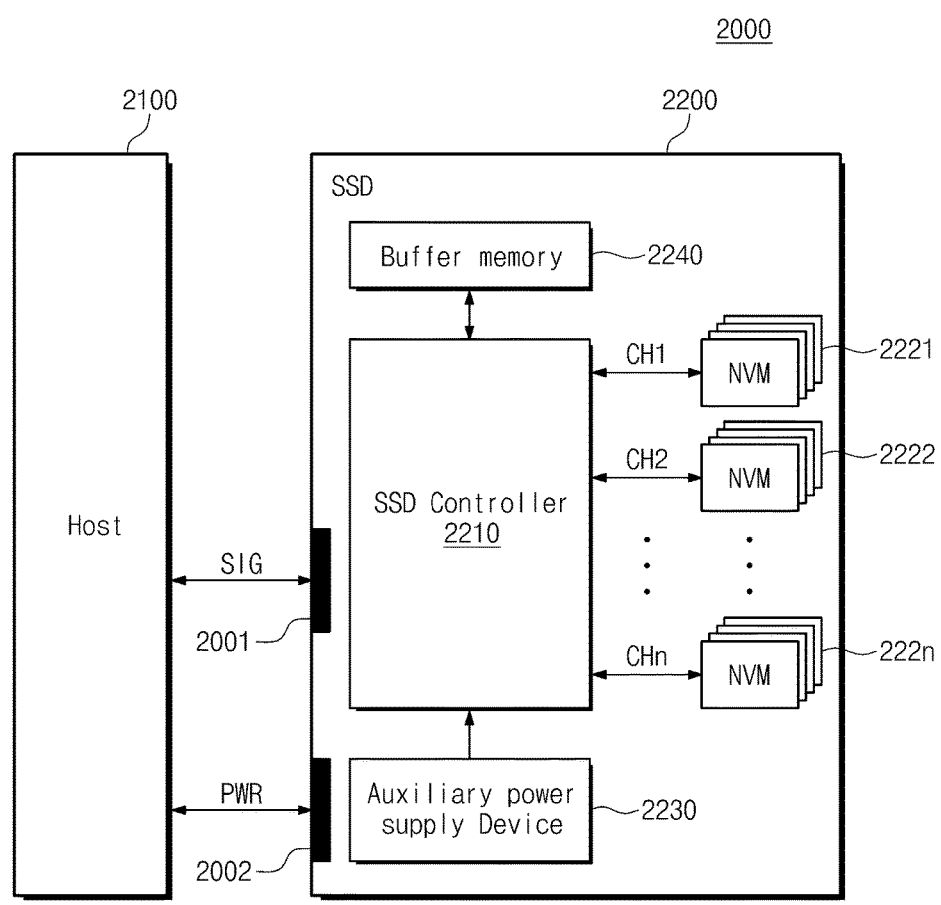
FIG. 17 is a block diagram illustrating a solid state drive (SSD) including the nonvolatile memory system, according to an embodiment of the disclosure.

FIG. 17 is a block diagram illustrating a solid state drive (SSD) system including the nonvolatile memory system, according to an embodiment of the disclosure. Referring to FIG. 17, the solid state drive (SSD) system 2000 may include a host 2100 and an SSD 2200. The SSD 2200 may exchange signals SIG with the host 2100 through a signal connector 2001 and may be supplied with power PWR through a power connector 2002. The SSD 2200 may include an SSD controller 2210, a plurality of flash memories 2221 to 222n, an auxiliary power supply 2230, and a buffer memory 2240.

The SSD controller 2210 may control the flash memories 2221 to 222n in response to the signal SIG from the host 2100. The flash memories 2221 to 222n may perform a program operation under control of the SSD controller 2210. In an embodiment, according to the operation method described with reference to FIGS. 1 to 14, the SSD controller 2210 may determine the continuity of the write command based on the idle time and may control the operation mode based on the determination result.

The auxiliary power supply 2230 may be connected to the host 2100 via the power connector 2002. The auxiliary power supply 2230 may be charged by power from the host 2100. When power is not smoothly supplied from the host 2100, the auxiliary power supply 2230 may power the SSD system 2000. The auxiliary power supply 2230 may be placed inside or outside the SSD 2200. For example, the auxiliary power supply 2230 may be located on a main board or a separate printed circuit board and may supply an auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 322n. The buffer memory 2240 may include volatile memories, such as a DRAM, an SDRAM, a DDR SDRAM, an LPDDR SDRAM, and an SRAM, or nonvolatile memories, such as a FRAM, an ReRAM, an STT-MRAM, and a PRAM.

Figure 18:
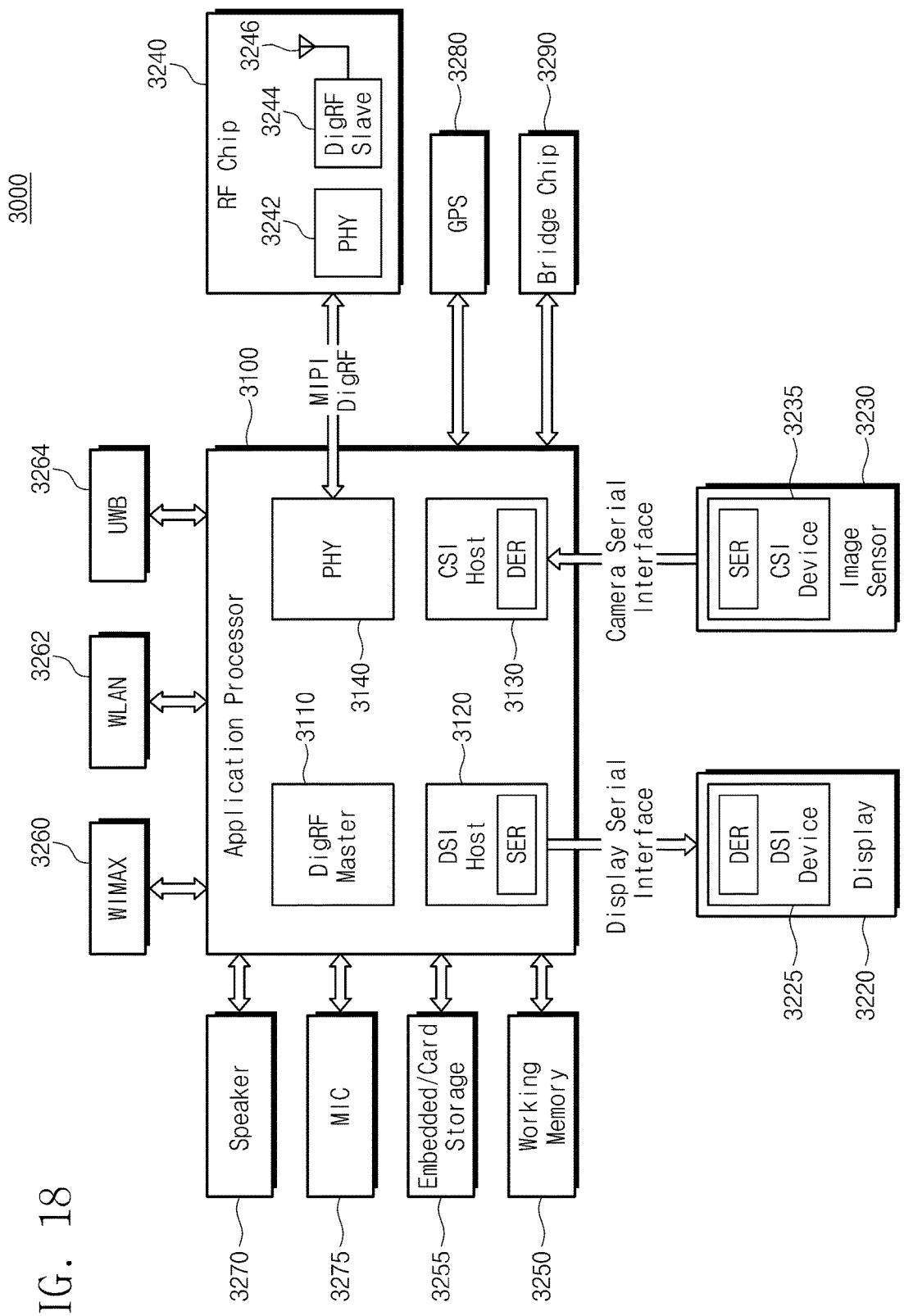
FIG. 18 is a block diagram illustrating an electronic system including the nonvolatile memory system, according to an embodiment of the disclosure.

FIG. 18 is a block diagram illustrating an electronic system including the nonvolatile memory system, according to an embodiment of the disclosure. In an embodiment, the electronic system 3000 may be implemented with a data processing device capable of using or supporting an interface offered by the mobile industry processor interface (MIPI) alliance. In an embodiment, the electronic system 3000 may be implemented with an electronic device such as a portable communication terminal, a personal digital assistant (PDA), a portable multimedia player (PMP), a smart phone, a wearable device, or the like.

The electronic system 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 through DSI. In exemplary embodiments, an optical serializer SER may be implemented in the DSI host 3120. In exemplary embodiments, an optical deserializer DES may be implemented in the DSI device 3225.

The CSI host 3130 may communicate with a CSI device 3235 of the image sensor 3230 through a CSI. In exemplary embodiments, an optical deserializer may be implemented in the CSI host 3130. In exemplary embodiments, an optical serializer may be implemented in the CSI device 3235.

The electronic system 3000 may further include a radio frequency (RF) chip 3240 for communicating with the application processor 3100. The RF chip 3240 may include a physical layer 3242, a DigRF slave 3244, and an antenna 3246. For example, the physical layer 3242 of the RF chip 3240 and the physical layer 3140 of the application processor 3100 may exchange data with each other through a DigRF interface offered by the MIPI alliance.

The electronic system 3000 may further include a working memory 3250 and an embedded/card storage 3255. The working memory 3250 and the embedded/card storage 3255 may store data received from the application processor 3100. The working memory 3250 and the embedded/card storage 3255 may provide data stored therein to the application processor 3100.

The working memory 3250 may temporarily store data, which was processed or will be processed by the application processor 3100. The working memory 3250 may include a nonvolatile memory, such as a flash memory, a PRAM, an MRAM, an ReRAM, or a FRAM, or a volatile memory, such as an SRAM, a DRAM, or an SDRAM.

The embedded/card storage 3255 may store data regardless of a power supply. In an embodiment, the embedded/card storage 3255 may comply with the UFS interface protocol. However, embodiments of the disclosure may not be limited thereto. In an embodiment, the embedded/card storage 3255 may include a nonvolatile memory system described with reference to FIGS. 1 to 17. The embedded/card storage 3255 may change the operation mode based on the operation method described with reference to FIGS. 1 to 17.

The electronic system 3000 may communicate with an external system through a communication protocol such as a worldwide interoperability for microwave access (Wi-MAX) 3260, a wireless local area network (WLAN) 3262, or an ultra-wideband (UWB) 3264, or the like.

The electronic system 3000 may further include a speaker 3270 and a microphone 3275 for processing voice information. The electronic system 3000 may further include a global positioning system (GPS) device 3280 for processing position information. The electronic system 3000 may further include a bridge chip 3290 for managing connections between peripheral devices.

As described above, the nonvolatile memory system 100 may determine the continuity of the received write command based on the idle time and may control the operation mode based on the determination result. Therefore, this may mean that the performance and life of the nonvolatile memory system are improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from embodiments of the disclosure. Therefore, it should be understood that the above embodiments are not limiting, but illustrative.

What is claimed is:

1. An operation method of a nonvolatile memory system, the method comprising:
   receiving a write command from an external device;
   determining, as a determination result, continuity of the write command based on an idle time; and
   performing a write operation of the write command in one of a fast mode and a normal mode, based on the determination result, wherein:
   the write operation for the write command is performed in the fast mode when the continuity of the write command is determined to be continuous, and
   the write operation for the write command is performed in the normal mode when the continuity of the write command is determined to be discontinuous.

2. The method of claim 1, wherein:
   the nonvolatile memory system comprises a first region and a second region,
   each of the first and second regions comprises a plurality of memory cells,
   the plurality of memory cells of the first region are configured to store N (N being a natural number) data bits per cell, and
   the plurality of memory cells of the second region are configured to store M (M being a natural number greater than N) data bits per cell.

3. The method of claim 2, wherein:
   the fast mode is an operation mode in which the write operation is performed in the first region, and
   the normal mode is an operation mode in which the write operation is performed in the second region.

4. The method of claim 2, further comprising migrating data stored in the first region to the second region during a background operation.

5. The method of claim 1, wherein:
   the idle time is between the write command and a previously-received write command, and
   the determining of the continuity comprises:
   comparing the idle time with a reference time; and
   determining that the write command is continuous when the idle time is less than the reference time; and
   determining that the write command is discontinuous when the idle time is greater than or equal to the reference time.

6. The method of claim 5, wherein the performing of the write operation comprises:
  comparing, with a reference value and to obtain a comparison result, a number of write commands that are continuous with the write command, from among write commands received before the write command, when the write command is determined to be continuous, and
  performing the write operation of the write command in one of the fast mode and the normal mode, based on the comparison result between the reference value and the number of write commands that are continuous.

7. The method of claim 6, further comprising:
  performing the write operation of the write command based on the fast mode when the number of write commands that are continuous is greater than the reference value, and
  performing the write operation of the write command based on the normal mode when the number of write commands that are continuous is not greater than the reference value.

8. The method of claim 1, wherein:
  the nonvolatile memory system comprises at least one flash memory device, and
  the at least one flash memory device comprises a three-dimensional memory array.

9. An operation method of a nonvolatile memory system, wherein the nonvolatile memory system comprises a first region storing one data bit per cell and a second region storing three data bits per cell, wherein the method comprises:
  receiving a first write command from an external device;
  performing a first write operation of the first write command in the second region;
  receiving a second write command from the external device;
  determining continuity between the first and second write commands based on an idle time between the first write command and the second write command; and
  performing a second write operation of the second write command at the first region when the first and second write commands are determined to be continuous, and at the second region when the first and second write commands are determined to be discontinuous.

10. The method of claim 9, wherein the determining of the continuity comprises:
  comparing the idle time with a reference time; and
  determining that the first and second write commands are discontinuous with each other when the idle time is greater than or equal to the reference time, and
  determining that the first and second write commands are continuous with each other when the idle time is less than the reference time.

* * * * *